United States Patent
Seo et al.

(10) Patent No.: US 11,925,052 B2
(45) Date of Patent: Mar. 5, 2024

(54) DISPLAY PANEL AND ELECTRONIC APPARATUS INCLUDING THE SAME

(71) Applicant: Samsung Display Co., Ltd., Yongin-si (KR)

(72) Inventors: Seungwoo Seo, Yongin-si (KR); Youngseo Choi, Yongin-si (KR); Jaehyun Kim, Yongin-si (KR); Sangyeol Kim, Yongin-si (KR); Jihwang Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 44 days.

(21) Appl. No.: 17/337,304

(22) Filed: Jun. 2, 2021

(65) Prior Publication Data

US 2022/0029130 A1   Jan. 27, 2022

(30) Foreign Application Priority Data

Jul. 27, 2020   (KR) .................... 10-2020-0093033

(51) Int. Cl.
*H10K 50/844* (2023.01)
*H10K 50/15* (2023.01)
*H10K 50/16* (2023.01)
*H10K 50/17* (2023.01)
(Continued)

(52) U.S. Cl.
CPC ........... *H10K 50/844* (2023.02); *H10K 50/15* (2023.02); *H10K 50/16* (2023.02); *H10K 50/171* (2023.02); *H10K 59/124* (2023.02); *H10K 59/65* (2023.02)

(58) Field of Classification Search
CPC ........... H10K 51/5092; H10K 51/5056; H10K 51/5253; H10K 51/5072; H10K 51/5221; H10K 27/3234; H10K 27/3258; H10K 27/323; H10K 59/40; H10K 59/124;
(Continued)

(56) References Cited

U.S. PATENT DOCUMENTS 9,905,629 B2   2/2018   Kim et al.
10,135,025 B2  11/2018   Kim et al.
10,319,938 B2   6/2019   Choi et al.
(Continued)

FOREIGN PATENT DOCUMENTS

KR       10-1483193 B1    1/2015
KR    10-2017-0096646 A   8/2017
(Continued)

*Primary Examiner* — Vongsavanh Sengdara
(74) *Attorney, Agent, or Firm* — Lewis Roca Rothgerber Christie LLP

(57) ABSTRACT

A display panel includes: a substrate including an opening penetrating from an upper surface to a lower surface of the substrate; a light emitting diode in a display area around the opening and including: a pixel electrode; an opposite electrode; and an intermediate layer between the pixel electrode and the opposite electrode; and a thin film encapsulation layer on the light emitting diode and including an organic encapsulation layer and at least one inorganic encapsulation layer, wherein the opposite electrode and at least one organic material layer of the intermediate layer extend toward the opening, wherein a portion of the opposite electrode facing the opening protrudes further toward the opening than the at least one organic material layer and includes a burr covered by the organic encapsulation layer.

27 Claims, 21 Drawing Sheets

(51) Int. Cl.
*H10K 59/124* (2023.01)
*H10K 59/65* (2023.01)

(58) Field of Classification Search
CPC ...... H10K 59/65; H10K 50/171; H10K 50/16; H10K 50/15; H10K 50/844; H10K 50/82
See application file for complete search history.

(56) References Cited

U.S. PATENT DOCUMENTS

| | | | |
|---|---|---|---|
| 10,541,380 B1 | 1/2020 | Sung et al. | |
| 10,673,020 B2 | 6/2020 | Kim | |
| 2017/0288004 A1* | 10/2017 | Kim | H10K 77/10 |
| 2020/0136068 A1 | 4/2020 | Lee et al. | |
| 2020/0168671 A1 | 5/2020 | Jang et al. | |
| 2020/0212159 A1 | 7/2020 | Lee | |
| 2020/0357869 A1* | 11/2020 | Choi | H10K 50/844 |
| 2020/0403047 A1 | 12/2020 | Oh et al. | |
| 2021/0005841 A1 | 1/2021 | Ohta | |
| 2021/0111231 A1 | 4/2021 | Choi et al. | |

FOREIGN PATENT DOCUMENTS

| | | |
|---|---|---|
| KR | 10-2018-0009845 A | 1/2018 |
| KR | 10-2020-0033376 A | 3/2020 |
| KR | 10-2020-0036130 A | 4/2020 |
| KR | 10-2021-0044359 A | 4/2021 |
| WO | WO 2019/130480 A1 | 7/2019 |

* cited by examiner

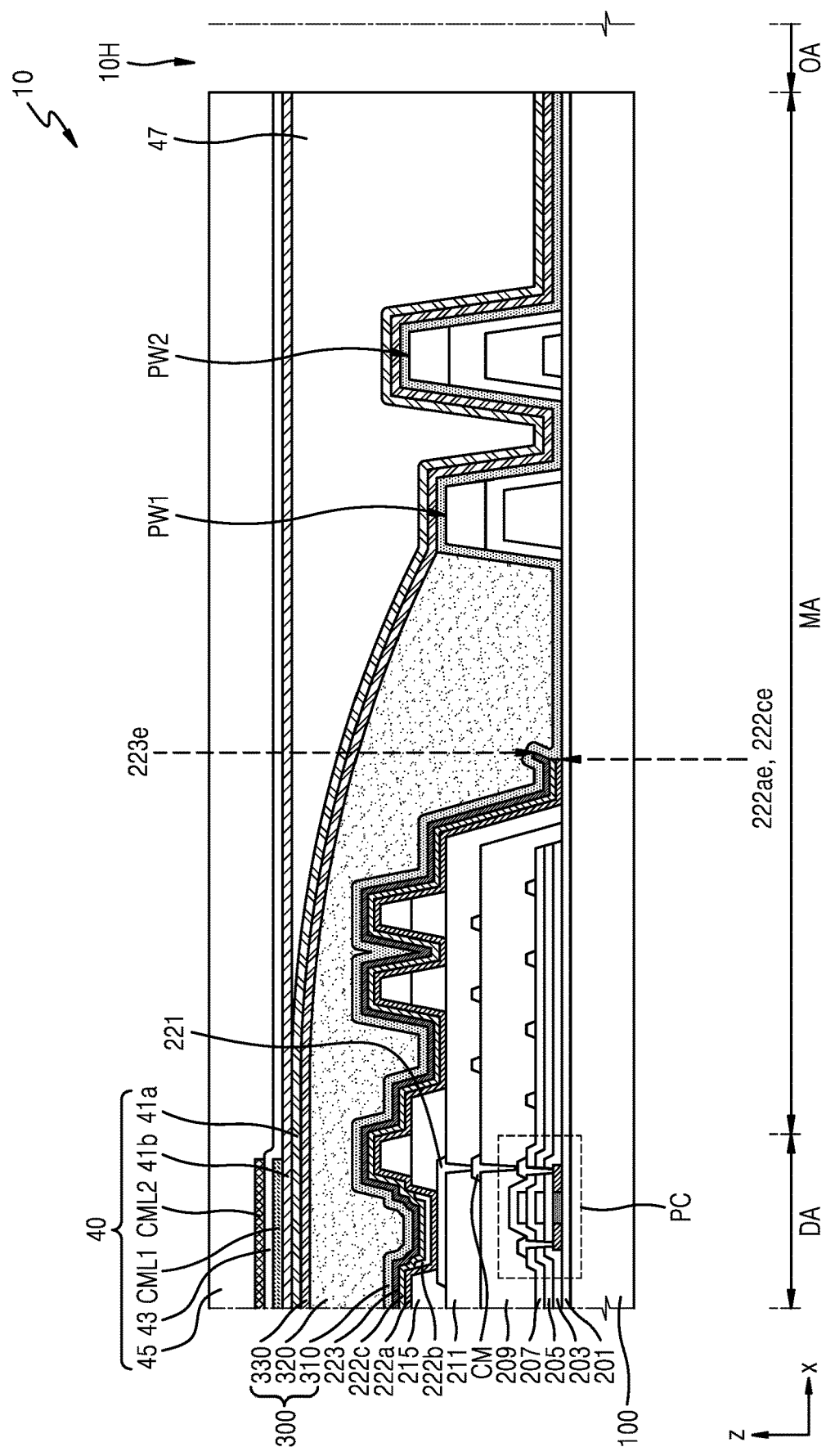

DISPLAY PANEL AND ELECTRONIC APPARATUS INCLUDING THE SAME

CROSS-REFERENCE TO RELATED APPLICATION

The present application claims priority to and the benefit of Korean Patent Application No. 10-2020-0093033, filed on Jul. 27, 2020, in the Korean Intellectual Property Office, the entire disclosure of which is incorporated by reference herein.

BACKGROUND

1. Field

Aspects of one or more embodiments relate to a display panel and an electronic apparatus including the same.

2. Description of Related Art

Recently, display panels have been used for various purposes. Also, as display panels have become thinner and lighter, their range of uses has widened.

As an area occupied by a display area in a display panel expands, various functions combined or associated with a display panel may be added. As a way of adding various functions while expanding the area, research has been conducted on the use of a portion of the display area for functions other than a function of displaying images.

The above information disclosed in this Background section is only for enhancement of understanding of the background and therefore the information discussed in this Background section does not necessarily constitute prior art.

SUMMARY

Aspects of one or more embodiments include a display panel including at least one opening arranged inside a display area and an electronic apparatus including the display panel.

Additional aspects will be set forth in part in the description which follows and, in part, will be apparent from the description, or may be learned by practice of the presented embodiments.

According to one or more embodiments, a display panel includes a substrate including an opening penetrating from an upper surface to a lower surface of the substrate, a light emitting diode arranged in a display area around the opening and including a pixel electrode, an opposite electrode, and an intermediate layer between the pixel electrode and the opposite electrode, and a thin film encapsulation layer on the light emitting diode and including an organic encapsulation layer and at least one inorganic encapsulation layer, wherein the opposite electrode and at least one organic material layer of the intermediate layer extend toward the opening, wherein a portion of the opposite electrode facing the opening protrudes further toward the opening than the at least one organic material layer and includes a burr covered by the organic encapsulation layer.

According to some embodiments, an edge of the opposite electrode facing the opening may be closer to the opening than an edge of the at least one organic material layer.

According to some embodiments, the at least one organic material layer may include at least one of a hole transport layer, a hole injection layer, an electron transport layer, or an electron injection layer.

According to some embodiments, the burr may include silver (Ag), magnesium (Mg), aluminum (Al), platinum (Pt), palladium (Pd), gold (Au), nickel (Ni), neodymium (Nd), iridium (Ir), chromium (Cr)), lithium (Li), calcium (Ca), or an alloy thereof.

According to some embodiments, the display panel may further include a first partition arranged between the display area and the opening, wherein an edge of the opposite electrode and an edge of the at least one organic material layer may be closer to the display area than the first partition.

According to some embodiments, the display panel may further include a second partition arranged closer to the opening than the first partition, wherein a height of the second partition may be different from a height of the first partition.

According to some embodiments, the display panel may further include a transistor electrically connected to the light emitting diode, and an organic insulating layer between the transistor and the light emitting diode.

According to some embodiments, the display panel may further include a structure arranged on the organic insulating layer and including a plurality of protrusions and a concave valley between the plurality of protrusions, wherein a portion of the organic encapsulation layer may be in the concave valley.

According to some embodiments, the display panel may further include signal lines arranged on the substrate, wherein at least one of the signal lines may include a bypass portion bypassing around the opening, wherein the bypass portion may overlap the plurality of protrusions or the concave valley.

According to some embodiments, the at least one inorganic encapsulation layer may include a first inorganic encapsulation layer arranged under the organic encapsulation layer and a second inorganic encapsulation layer arranged on the organic encapsulation layer, wherein the first inorganic encapsulation layer and the second inorganic encapsulation layer may directly contact each other in an area between the first partition and the opening.

According to some embodiments, the display panel may further include a planarization insulating layer arranged on the second inorganic encapsulation layer to overlap a portion of the organic encapsulation layer and the first partition and including an organic insulating material.

According to some embodiments, the planarization insulating layer may have a closed-loop shape covering the periphery of the opening.

According to some embodiments, the planarization insulating layer may cover the display area and the periphery of the opening.

According to one or more embodiments, an electronic apparatus includes a display panel including an opening, a display area around the opening, and an intermediate area between the opening and the display area, and a component arranged to overlap the opening, the display panel including a substrate, a light emitting diode arranged in the display area and including a pixel electrode, an opposite electrode, and an intermediate layer between the pixel electrode and the opposite electrode, a transistor arranged in the display area and electrically connected to the light emitting diode, an organic insulating layer between the transistor and the light emitting diode, a thin film encapsulation layer arranged on the light emitting diode and including an organic encapsulation layer and at least one inorganic encapsulation layer, and a first partition arranged on the substrate and surrounding the opening, wherein the opposite electrode and at least one organic material layer of the intermediate layer extend toward the opening, wherein a portion of the opposite electrode protrudes further toward the opening than the at least one organic material layer and is covered by the organic encapsulation layer.

According to some embodiments, the display panel may further include a plurality of protrusions located on the organic insulating layer and closer to the display area than the first partition and a concave valley between the plurality of protrusions, wherein a portion of the organic encapsulation layer may be in the concave valley.

According to some embodiments, the opposite electrode and the at least one organic material layer may extend beyond the plurality of protrusions and the concave valley.

According to some embodiments, an edge of the opposite electrode facing the opening and an edge of the at least one organic material layer may be located between the display area and the first partition, wherein the edge of the at least one organic material layer may be closer to the display area than the edge of the opposite electrode.

According to some embodiments, the at least one organic material layer may include at least one of a hole transport layer, a hole injection layer, an electron transport layer, or an electron injection layer.

According to some embodiments, the at least one inorganic encapsulation layer may include a first inorganic encapsulation layer arranged under the organic encapsulation layer and a second inorganic encapsulation layer arranged on the organic encapsulation layer, wherein the first inorganic encapsulation layer and the second inorganic encapsulation layer may directly contact each other in an area between the first partition and the opening.

According to some embodiments, the display panel may further include a second partition arranged closer to the opening than the first partition, wherein a height of the second partition may be greater than a height of the first partition.

According to some embodiments, the display panel may further include a third partition arranged closer to the opening than the second partition, wherein a height of the third partition may be smaller than the height of the first partition and the height of the second partition.

According to some embodiments, the display panel may further include an input sensing layer arranged on the thin film encapsulation layer and including at least one conductive layer and at least one insulating layer.

According to some embodiments, the display panel may further include a planarization insulating layer arranged on the thin film encapsulation layer, overlapping a portion of the organic encapsulation layer and the first partition, and including an organic insulating material.

According to some embodiments, the at least one insulating layer of the input sensing layer may include the planarization insulating layer and cover the periphery of the opening and the display area.

According to some embodiments, the component may include a sensor or a camera.

According to some embodiments, a portion of the opposite electrode may protrude further toward the opening than the at least one organic material layer and include a burr including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof.

Other aspects, features, and characteristics of some embodiments other than those described above will become more apparent from the accompanying drawings, the appended claims and their equivalents, and the detailed description of the disclosure.

BRIEF DESCRIPTION OF THE DRAWINGS

The above and other aspects, features, and characteristics of certain embodiments will be more apparent from the following description taken in conjunction with the accompanying drawings, in which:

FIGS. 9A to 9E are cross-sectional views illustrating a display panel manufacturing process according to some embodiments;

DETAILED DESCRIPTION

Figure 1:
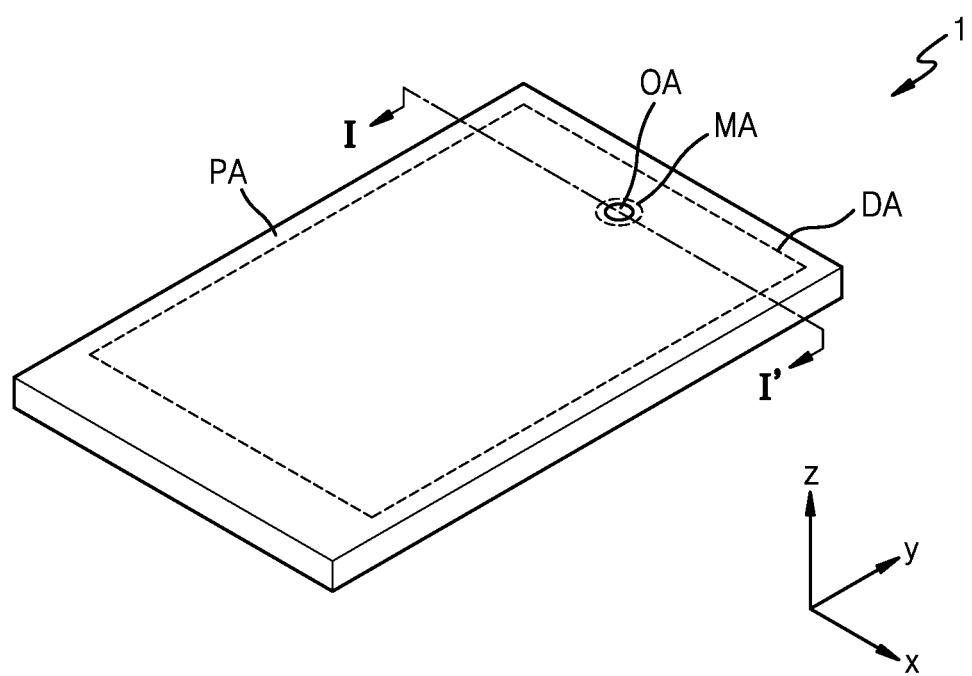
FIG. 1 is a perspective view schematically illustrating an electronic apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Because the disclosure may have diverse modified embodiments, particular embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Aspects of one or more embodiments of the disclosure will be described below in more detail with reference to the accompanying drawings. Those components that are the same or are in correspondence with each other are rendered the same reference numeral regardless of the figure number, and redundant descriptions are omitted.

It will be understood that although terms such as "first" and "second" may be used herein to describe various components, these components should not be limited by these terms and these terms are only used to distinguish one component from another component.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it may be directly or indirectly formed on the other layer, region, or element. That is, for example, intervening layers, regions, or elements may be present.

Sizes of elements in the drawings may be exaggerated for convenience of description. In other words, because sizes and thicknesses of components in the drawings are arbitrarily illustrated for convenience of description, the following embodiments are not limited thereto.

When a certain embodiment may be implemented differently, a particular process order may be performed differently from the described order. For example, two consecutively described processes may be performed substantially at the same time or performed in an order opposite to the described order.

It will be understood that when a layer, region, or component is referred to as being connected to another layer, region, or component, it may be directly or indirectly connected to the other layer, region, or component. That is, for example, intervening layers, regions, or components may be present. For example, it will be understood that when a layer, region, or component is referred to as being "electrically connected to" another layer, region, or component, it may be "directly electrically connected to" the other layer, region, or component or may be "indirectly electrically connected to" the other layer, region, or component with one or more intervening layers, regions, or components therebetween.

As used herein, "A and/or B" represents the case of A, B, or A and B. Also, "at least one of A or B" represents the case of A, B, or A and B.

FIG. 1 is a perspective view schematically illustrating an electronic apparatus according to some embodiments.

Referring to FIG. 1, an electronic apparatus 1 may be an apparatus for displaying moving images (e.g., video images) or still images (e.g., static images) and may be used as a display screen of various products such as televisions, notebook computers, monitors, billboards, and Internet of Things (IoT) as well as portable electronic apparatuses such as mobile phones, smart phones, tablet personal computers (PCs), mobile communication terminals, electronic notebooks, electronic books, portable multimedia players (PMPs), navigation, and Ultra Mobile PCs (UMPCs). Also, the electronic apparatus 1 according to some embodiments may be used in wearable devices such as smart watches, watch phones, glasses-type displays, and head-mounted displays (HMDs). Also, the electronic apparatus 1 some embodiments may be used as a center information display (CID) located at a vehicle's instrument panel or a vehicle's center fascia or dashboard, a room mirror display replacing a vehicle's side mirror, or a display located at a rear side of a vehicle's front seat as an entertainment for a vehicle's rear seat. For convenience of description, FIG. 1 illustrates that the electronic apparatus 1 according to some embodiments is used as a smart phone.

The electronic apparatus 1 may be formed in a rectangular shape in a plan view. For example, the electronic apparatus 1 may have a rectangular planar shape having a short side in the x direction and a long side in the y direction as illustrated in FIG. 1. An edge where the short side in the x direction and the long side in the y direction meet each other may be formed in a round shape having a certain curvature or may be formed in a right-angle shape. The planar shape of the electronic apparatus 1 is not limited to a rectangular shape and may be any other polygonal shape, an elliptical shape, or an irregular shape.

The electronic apparatus 1 may include an opening area OA (or a first area) and a display area DA (or a second area) at least partially surrounding the opening area OA. The electronic apparatus 1 may include an intermediate area MA as a third area located between the opening area OA and the display area DA, and a peripheral area PA (or a fourth area) outside the display area DA, for example, around the display area DA.

The opening area OA may be located inside the display area DA. According to some embodiments, the opening area OA may be arranged at the upper center of the display area DA as illustrated in FIG. 1. Alternatively, the opening area OA may be variously arranged such as arranged at the center of the display area DA or arranged at the upper left or upper right of the display area DA. In the plan view of the specification, "left," "right," "top," and "bottom" may refer to the directions when the electronic apparatus 1 is viewed in the vertical direction. For example, "left" may refer to the −x direction, "right" may refer to the +x direction, "top" may refer to the +y direction, and "bottom" may refer to the −y direction. FIG. 1 illustrates that one opening area OA is arranged; however, in other embodiments, a plurality of opening areas OA may be provided.

Figure 2:
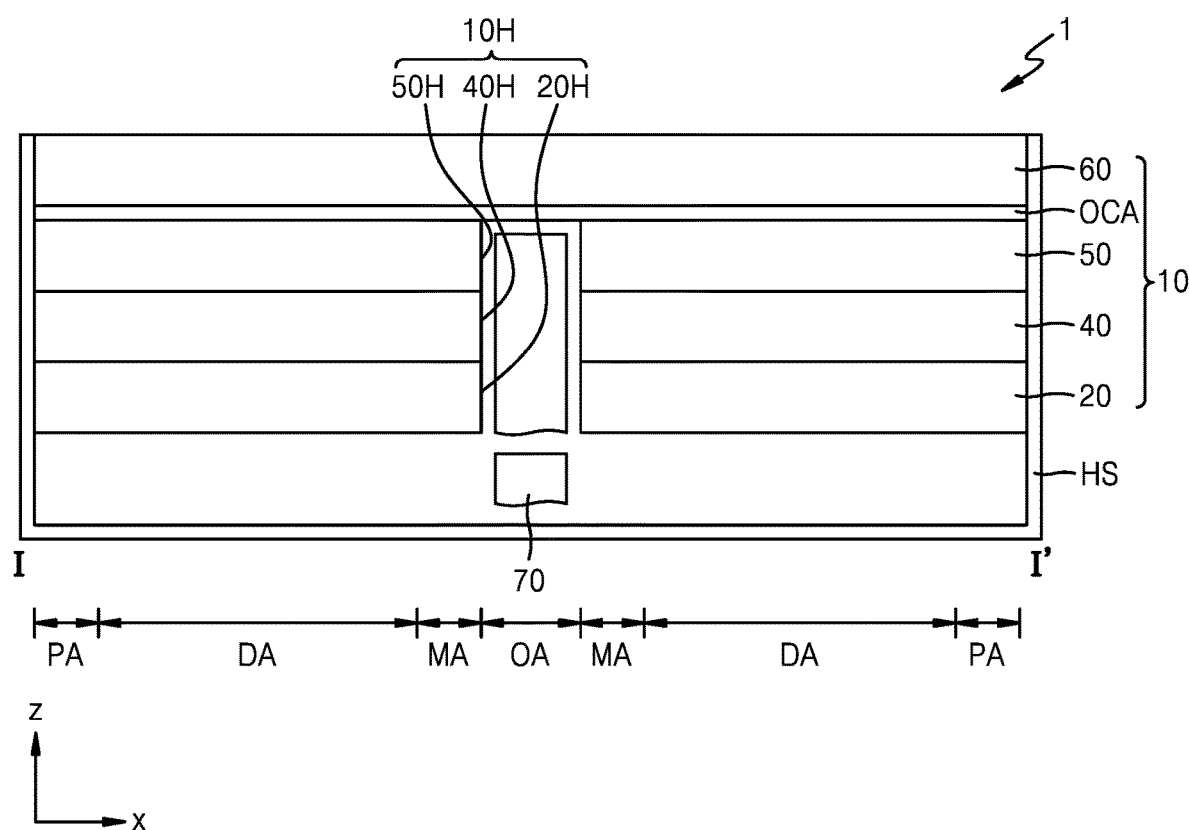
FIG. 2 is a simplified cross-sectional view of a display panel according to some embodiments, taken along the line I-I' of FIG. 1.

FIG. 2 is a simplified cross-sectional view of a display panel according to some embodiments, taken along the line I-I' of FIG. 1.

Referring to FIG. 2, the electronic apparatus 1 may include a display panel 10 and a component 70 arranged to overlap an opening 10H of the display panel 10.

The display panel 10 and the component 70 may be accommodated in a housing HS.

The display panel 10 may include a display element layer 20, an input sensing layer 40, an optical functional layer 50, and a cover window 60.

The display element layer 20 may include display elements that emit light to display images. The display elements may each include a light emitting diode, for example, an organic light emitting diode including an organic emission layer. According to some embodiments, the light emitting diode may be an inorganic light emitting diode including an inorganic material. The inorganic light emitting diode may include a PN diode including inorganic semiconductor-based materials. When a voltage is applied to a PN junction diode in a forward direction, holes and electrons may be injected thereinto and energy generated by recombination of the holes and electrons may be converted into light energy to emit light of a certain color. The inorganic light emitting diode described above may have a width of several to several hundred micrometers or a width of several to several hundred nanometers, and according to some embodiments, the inorganic light emitting diode may be referred to as a micro LED or nano LED.

The input sensing layer 40 may be configured to acquire coordinate information according to an external input signal, for example, a touch event (e.g., from a user's finger, a stylus, etc.). The input sensing layer 40 may include a sensing electrode (or a touch electrode) and signal lines (trace lines) connected to the sensing electrode. The input sensing layer 40 may be arranged on the display element layer 20. The input sensing layer 40 may be configured to sense an external input by a mutual capacitance method and/or a self capacitance method, or any other suitable touch input sensing technique.

The input sensing layer 40 may be directly formed on the display element layer 20 or may be separately formed and then coupled thereto through an adhesive layer such as an optical clear adhesive. For example, the input sensing layer 40 may be continuously formed after the process of forming the display element layer 20, and in this case, an adhesive layer may not be located between the input sensing layer 40 and the display element layer 20. FIG. 2 illustrates that the input sensing layer 40 is arranged between the display element layer 20 and the optical functional layer 50; however, according to some embodiments, the input sensing layer 40 may be arranged on the optical functional layer 50.

The optical functional layer 50 may include an anti-reflection layer. The anti-reflection layer may be configured to reduce the reflectance of light (external light) incident from the outside through the cover window 60 toward the display panel 10. The anti-reflection layer may include a phase retarder and a polarizer.

According to some embodiments, the anti-reflection layer may include a black matrix and color filters. The color filters may be arranged considering the color of light emitted from each of the light emitting diodes of the display element layer 20. According to some embodiments, the anti-reflection layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, and thus the reflectance of external light may be reduced.

The optical functional layer 50 may include a lens layer. The lens layer may be configured to improve the light emission efficiency of light emitted from the display element layer 20 or may be configured to reduce a color deviation. The lens layer may include a layer having a concave or convex lens shape and/or may include a plurality of layers having different refractive indexes. The optical functional layer 50 may include both the anti-reflection layer and the lens layer described above or may include any one of them.

The display panel 10 may include an opening 10H corresponding to the opening area OA of the electronic apparatus 1. In this regard, FIG. 2 illustrates that the display element layer 20, the input sensing layer 40, and the optical functional layer 50 respectively include first to third openings 20H, 40H, and 50H and the first to third openings 20H, 40H, and 50H overlapping each other form the opening 10H of the display panel 10.

The first opening 20H may penetrate the bottom surface from the top surface of the display element layer 20, the second opening 40H may penetrate the bottom surface from the top surface of the input sensing layer 40, and the third opening 50H may penetrate the bottom surface from the top surface of the optical functional layer 50.

The opening 10H of the display panel 10, for example, the first to third openings 20H, 40H, and 50H, may be located to overlap each other in the opening area OA. The sizes (or diameters) of the first to third openings 20H, 40H and 50H may be equal to or different from each other.

According to some embodiments, at least one of the display element layer 20, the input sensing layer 40, or the optical functional layer 50 may not include an opening. For example, any one or two of the display element layer 20, the input sensing layer 40, and the optical functional layer 50 may not include an opening.

The cover window 60 may be arranged on the optical functional layer 50. The cover window 60 may be coupled to the optical functional layer 50 through an adhesive layer such as an optical clear adhesive OCA therebetween. The cover window 60 may include a glass material.

The opening area OA may be a type of component area (e.g., sensor area, camera area, or speaker area) in which the component 70 for adding various functions to the electronic apparatus 1 is located.

The component 70 may include an electronic element. For example, the component 70 may include an electronic element configured to transmit or receive a signal using light or sound. For example, the electronic element may include a sensor such as an infrared sensor using light, a camera for receiving light to acquire an image, a sensor for outputting and sensing light or sound to measure a distance or recognize a fingerprint or the like, a miniature lamp for outputting light, or a speaker for outputting sound. In the case of an electronic element using light, the electronic element may use light of various wavelength bands such as visible light, infrared light, and ultraviolet light. The opening area OA may correspond to a transmission area through which light and/or sound output from the component 70 to the outside or propagating from the outside toward the electronic element may be transmitted.

Unlike the display element layer 20, the input sensing layer 40, and the optical function layer 50, as illustrated in FIG. 2, the cover window 60 and the adhesive layer including the optical clear adhesive OCA thereunder may not include an opening.

According to some embodiments, when the electronic apparatus 1 is used as a smart watch or a vehicle instrument panel, the component 70 may be a member including a clock hand or a needle indicating certain information (e.g., vehicle speed). In this case, the cover window 60 may include an opening located in the opening area OA unlike the illustration of FIG. 1 such that the component 70 such as a needle may be exposed to the outside. Alternatively, even when the electronic apparatus 1 includes the component 70 such as a speaker, the cover window 60 may include an opening corresponding to the opening area OA.

Figure 3:
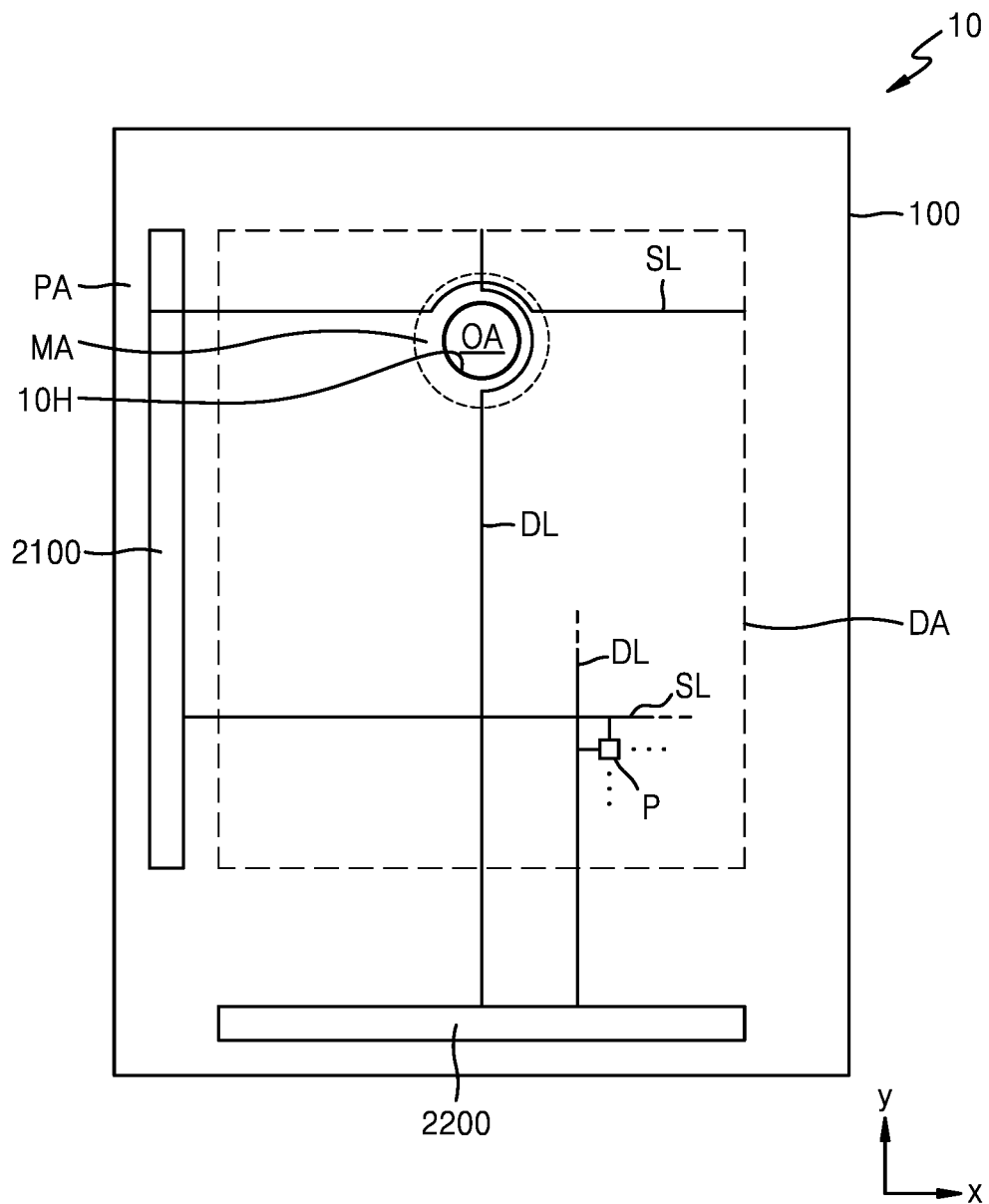
FIG. 3 is a plan view schematically illustrating a display panel according to some embodiments.
Figure 4:
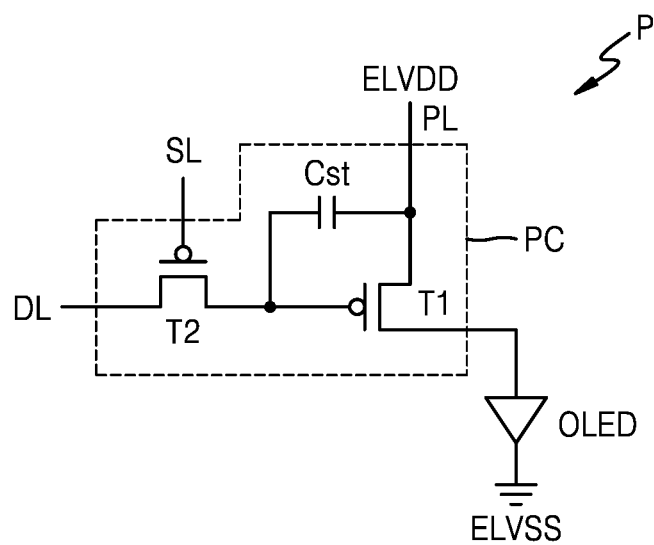
FIG. 4 illustrates an equivalent circuit connected to any one light emitting diode of a display panel according to some embodiments.

FIG. 3 is a plan view schematically illustrating a display panel according to some embodiments, and FIG. 4 illustrates an equivalent circuit connected to any one light emitting diode of a display panel according to some embodiments.

Referring to FIG. 3, the display panel 10 may include an opening area OA, a display area DA, an intermediate area MA, and a peripheral area PA. The display panel 10 may include a plurality of pixels P arranged in the display area DA, and the display panel 10 may display an image by using light emitted from the light emitting diode of each pixel P, for example, red, green, and blue light.

As illustrated in FIG. 4, the light emitting diode of each pixel P may include an organic light emitting diode OLED, and each organic light emitting diode OLED may be electrically connected to a pixel circuit PC. FIG. 4 illustrates that the light emitting diode includes the organic light emitting diode OLED; however, according to some embodiments, the display panel 10 may include the inorganic light emitting diode instead of the organic light emitting diode OLED as described above.

The pixel circuit PC may include a first thin film transistor T1, a second thin film transistor T2, and a storage capacitor Cst.

As a switching thin film transistor, the second transistor T2 may be connected to a scan line SL and a data line DL and may be configured to transmit a data voltage input from the data line DL to the first thin film transistor T1 according to a switching voltage input from the scan line SL. The storage capacitor Cst may be connected to the second thin film transistor T2 and a driving voltage line PL and may be configured to store a voltage corresponding to the difference between a voltage received from the second thin film transistor T2 and a first power voltage ELVDD supplied to the driving voltage line PL.

As a driving thin film transistor, the first thin film transistor T1 may be connected to the driving voltage line PL and the storage capacitor Cst and may be configured to control a driving current flowing from the driving voltage line PL through the organic light emitting diode OLED in response to a voltage value stored in the storage capacitor Cst. The organic light emitting diode OLED may emit light with a certain brightness according to the driving current. An opposite electrode (e.g., a cathode) of the organic light emitting diode OLED may be supplied with a second power voltage ELVSS.

Although FIG. 4 illustrates that the pixel circuit PC includes two thin film transistors and one storage capacitor, embodiments according to the present disclosure are not limited thereto. The number of thin film transistors and the number of storage capacitors may be variously modified according to the design of the pixel circuit PC.

Referring back to FIG. 3, the intermediate area MA may surround the opening area OA. The intermediate area MA may be an area in which a display element such as an organic light emitting diode emitting light is not arranged, and signal lines for providing signals to pixels P arranged around the opening area OA may pass through the intermediate area MA. For example, as illustrated in FIG. 3, data lines DL and/or scan lines SL may intersect the display area DA along the y direction and/or the x direction, while some of the data lines DL and/or the scan lines SL may bypass in the intermediate area MA along the edge of the opening 10H of the display panel 10.

A scan driver 2100 providing a scan signal to each pixel P, a data driver 2200 providing a data signal to each pixel P, and a first main power line and a second main power line for providing a first power voltage ELVDD (see FIG. 4) and a second power voltage ELVSS (see FIG. 4) may be arranged in the peripheral area PA. FIG. 3 illustrates that the data driver 2200 is arranged adjacent to one side of a substrate 100; however, according to some embodiments, the data driver 2200 may be arranged on a flexible printed circuit board electrically connected to a pad arranged at one side of the display panel 10. The flexible printed circuit board may have flexibility, and a portion of the flexible printed circuit board may be bent to be located under the rear surface of the substrate 100.

Figure 5:
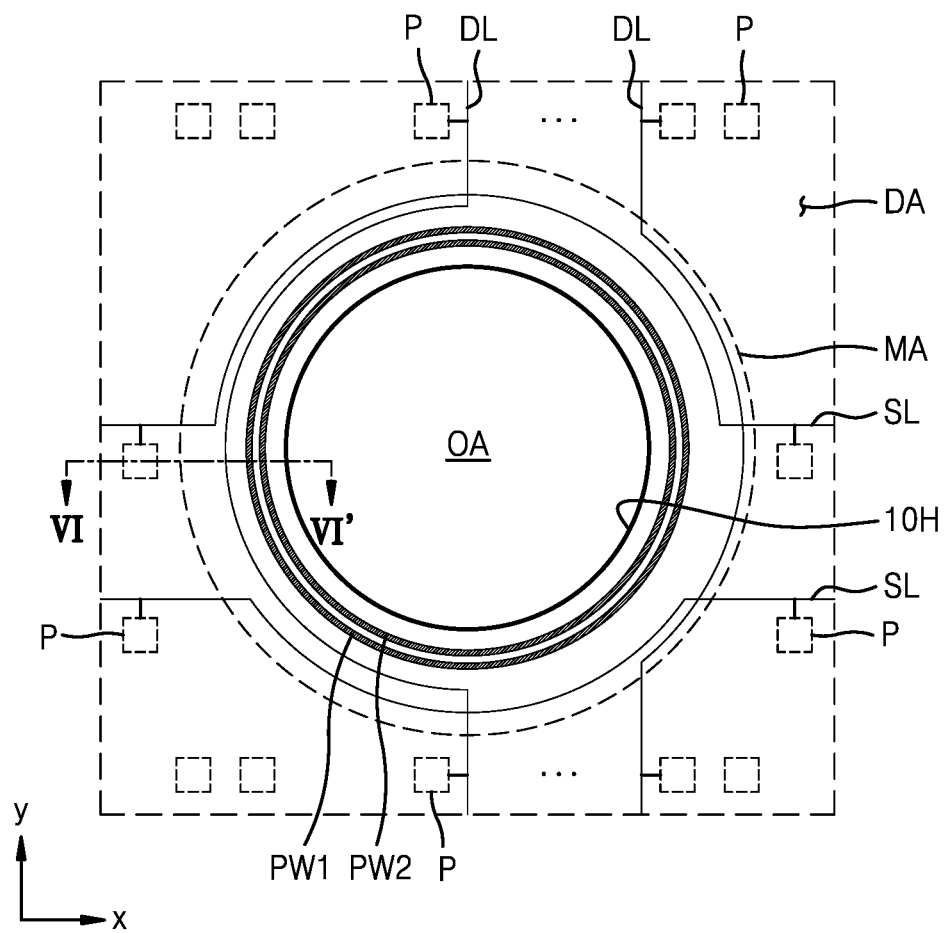
FIG. 5 is a plan view illustrating a portion of a display panel according to some embodiments.

FIG. 5 is a plan view illustrating a portion of a display panel according to some embodiments.

Referring to FIG. 5, pixels P may be arranged in the display area DA, and the intermediate area MA may be arranged between the opening area OA and the display area DA. The pixels P adjacent to the opening area OA may be arranged spaced apart from each other with respect to the opening area OA in the plan view. As illustrated in the plan view of FIG. 5, the pixels P may be arranged vertically spaced apart from each other with the opening area OA therebetween. The pixels P may be arranged horizontally spaced apart from each other a with the opening area OA therebetween. As described above with reference to FIGS. 3 and 4, each pixel P may use red, green, or blue light emitted from a light emitting diode, and the positions of pixels P illustrated in FIG. 4 may respectively correspond to the positions of light emitting diodes. Thus, the fact that the pixels P are arranged spaced apart from each other around the opening area OA in the plan view may represent that the light emitting diodes are arranged spaced apart from each other around the opening area OA in the plan view. For example, in the plan view, the light emitting diodes may be arranged vertically spaced apart from each other with the opening area OA therebetween or may be arranged horizontally spaced apart from each other with the opening area OA therebetween.

Among the signal lines supplying signals to the pixel circuit connected to the light emitting diode of each pixel P, signal lines adjacent to the opening area OA may bypass the opening area OA. Among the data lines passing through the display area DA, some data lines DL may extend in the ±y direction to provide data signals to the pixels P respectively arranged on and under the opening area OA and may bypass along the edge of the opening 10H and/or the opening area OA in the intermediate area MA. Among the scan lines passing through the display area DA, some scan lines SL may extend in the ±x direction to provide scan signals to the pixels P respectively arranged on the left and right sides with the opening area OA therebetween and may bypass along the edge of the opening 10H and/or the opening area OA in the intermediate area MA.

Although FIG. 5 illustrates that the scan line SL bypasses the opening area OA in the intermediate area MA, embodiments according to the present disclosure are not limited thereto. According to some embodiments, the scan line SL may be separated or disconnected around the opening area OA, the scan line SL arranged on the left side around the opening area OA may receive a signal from the scan driver 2100 arranged on the left side around the display area DA as illustrated in FIG. 3 and, according to some embodiments, the scan line SL arranged on the right side around the opening area OA may receive a signal from an additional scan driver arranged opposite the scan driver 2100 around the display area DA.

At least one partition arranged closer to the opening area OA than the bypass portion of the signal lines described above may be located in the intermediate area MA. In this regard, FIG. 5 illustrates a first partition PW1 and a second partition PW2. In the plan view, the first partition PW1 and the second partition PW2 may be arranged spaced apart from each other in a closed-loop shape surrounding the opening area OA.

Figure 6:
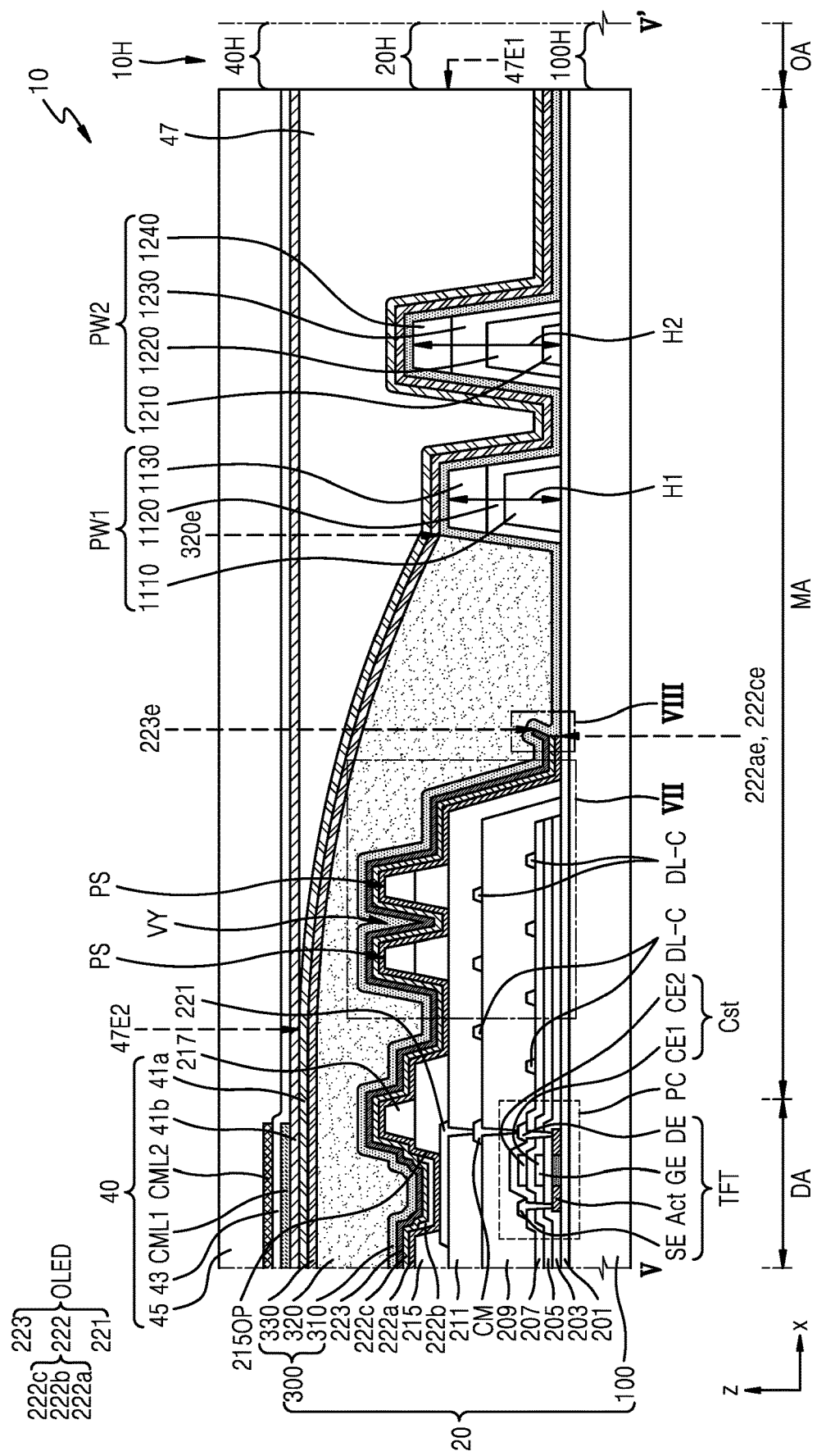
FIG. 6 is a cross-sectional view schematically illustrating a display panel according to some embodiments, corresponding to a cross-section taken along the line V-V' of FIG. 5.
Figure 7A:
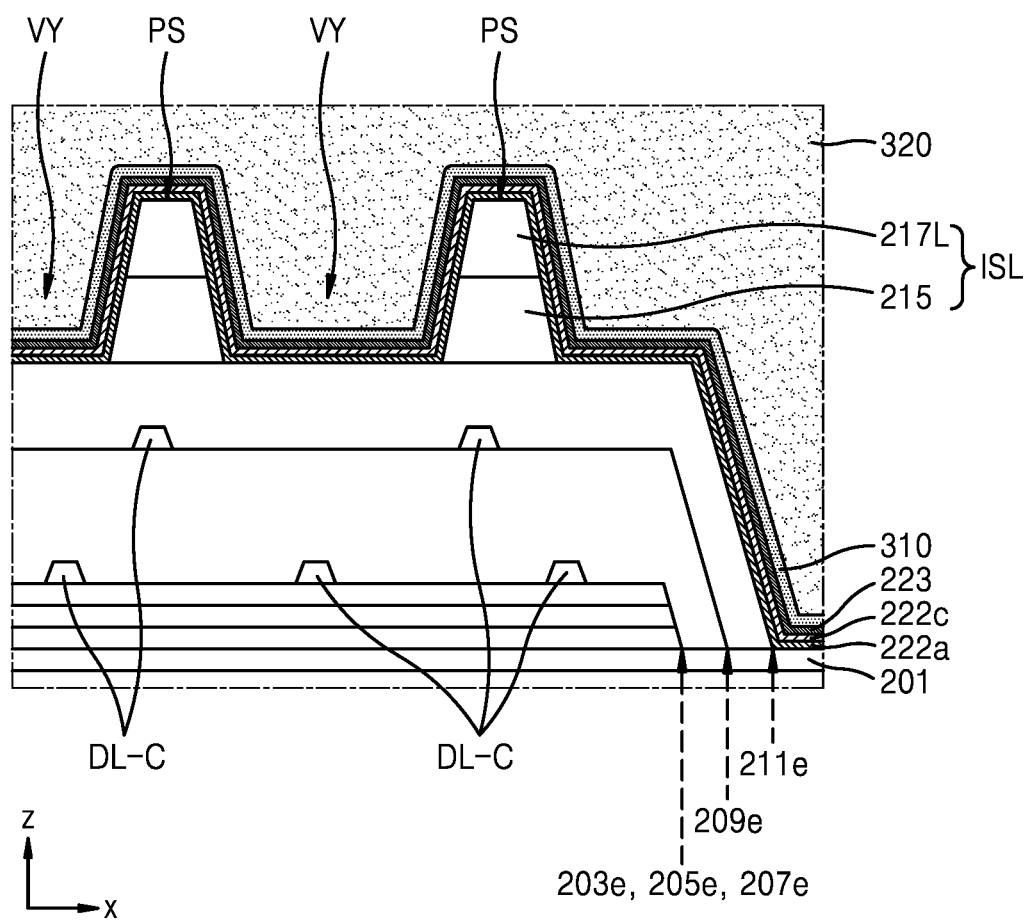
FIG. 7A is an enlarged cross-sectional view of the region VII of FIG. 6.
Figure 7B:
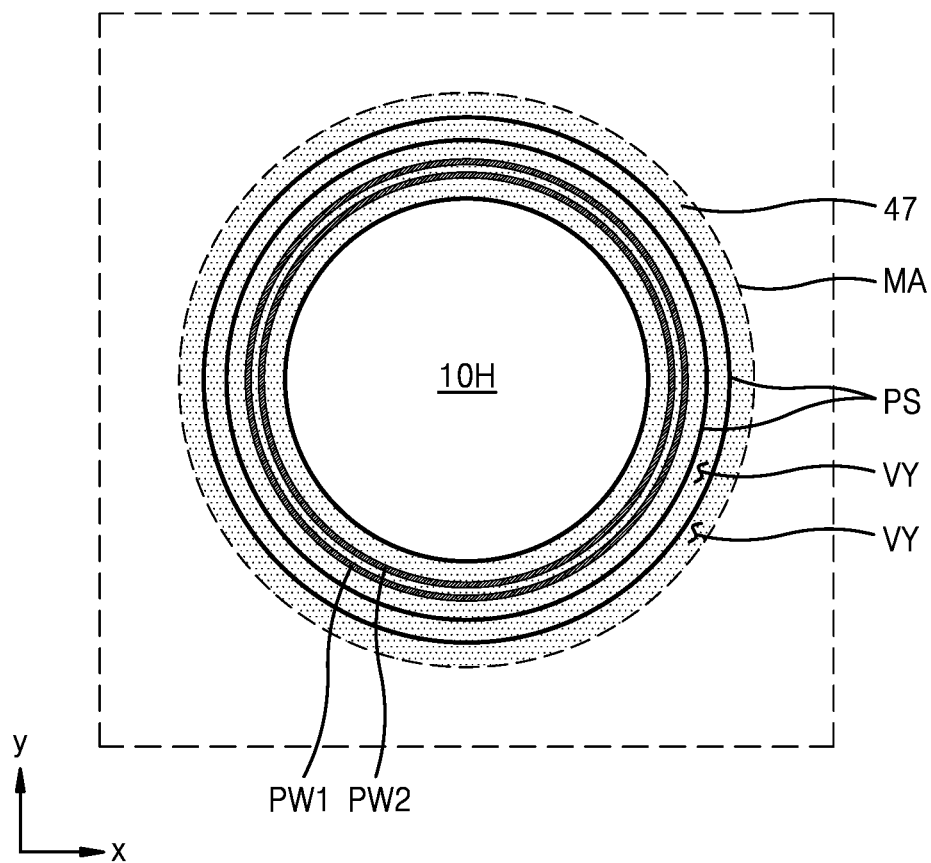
FIG. 7B is a plan view illustrating the relative positions of partitions, protrusions, and valleys of the display panel of FIG. 6.

FIG. 6 is a cross-sectional view schematically illustrating a display panel according to some embodiments, corresponding to a cross-section thereof taken along the line V-V' of FIG. 5, FIG. 7A is an enlarged cross-sectional view of region VII of FIG. 6, FIG. 7B is a plan view illustrating the relative positions of partitions, protrusions, and valleys of the display panel of FIG. 6, and FIG. 8A to 8C are enlarged cross-sectional views of region VIII of FIG. 6. In FIG. 6, the optical functional layer 50 (see FIG. 2) and the cover window 60 (see FIG. 2) of the display panel 10 are omitted for convenience of description.

Referring to FIG. 6, the display panel 10 may include a display element layer 20 including light emitting diodes arranged on a substrate 100, and an input sensing layer 40 on the display element layer 20. The display panel 10 may include an opening 10H located in the opening area OA. The opening 10H may have the shape of a through hole penetrating the upper and lower surfaces of the display panel 10. A plurality of components included in the display panel 10, for example, the substrate 100, may include an opening 100H that is located in the opening area OA and has the shape of a through hole penetrating the upper and lower surfaces of the substrate 100. Like the substrate 100, the components formed on the substrate 100, for example, a plurality of layers included in the display element layer 20 and the input sensing layer 40, may respectively include through hole-shaped openings 20H and 40H located in the opening area OA.

First, as for the display area DA of FIG. 6, a pixel circuit PC may be arranged on a substrate 100, and an organic light emitting diode OLED may be arranged on the pixel circuit PC.

The substrate 100 may include glass material or polymer resin. For example, the polymer resin may include polyether sulfone, polyacrylate, polyether imide, polyethylene naphthalate, polyethylene terephthalate, polyphenylene sulfide, polyarylate, polyimide, polycarbonate, and/or cellulose acetate propionate. The substrate 100 including the polymer resin may be flexible, rollable, or bendable. The substrate 100 may have a multilayer structure including an inorganic insulating layer and a layer including the above polymer resin.

A buffer layer 201 may be arranged on the upper surface of the substrate 100. The buffer layer 201 may prevent or reduce instances of impurities or contaminants penetrating into a semiconductor layer Act of a thin film transistor TFT. The buffer layer 201 may include an inorganic insulating material such as silicon nitride, silicon oxynitride, and silicon oxide and may be a single layer or a multiple layer including the inorganic insulating material.

A pixel circuit PC may be arranged on the buffer layer 201. The pixel circuit PC may include a thin film transistor TFT and a storage capacitor Cst. The thin film transistor TFT may include a semiconductor layer Act, a gate electrode GE, a source electrode SE, and a drain electrode DE. FIG. 6 illustrates a top gate type in which a gate electrode GE is arranged on a semiconductor layer Act with a gate insulating layer 203 therebetween; however, according to some embodiments, the thin film transistor TFT may be a bottom gate type.

The semiconductor layer Act may include polysilicon. Alternatively, the semiconductor layer Act may include amorphous silicon, may include an oxide semiconductor, or may include an organic semiconductor or the like. The gate electrode GE may include a low-resistance metal material. The gate electrode GE may include a conductive material including molybdenum (Mo), aluminum (Al), copper (Cu), titanium (Ti), or the like and may include a single layer or a multiple layer including the above material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and hafnium oxide. The gate insulating layer 203 may include a single layer or a multiple layer including the above material.

The source electrode SE and the drain electrode DE may include a material having high conductivity. The source electrode SE and the drain electrode DE may include a conductive material including molybdenum (Mo), aluminum (Al), copper (Cu), titanium (Ti), or the like and may include a single layer or a multiple layer including the above material. According to some embodiments, the source electrode SE and the drain electrode DE may include a multi-layer structure of titanium layer, aluminum layer, and titanium layer (Ti/Al/Ti).

The storage capacitor Cst may include a lower electrode CE1 and an upper electrode CE2 overlapping each other with a first interlayer insulating layer 205 therebetween. The storage capacitor Cst may overlap the thin film transistor TFT. In this regard, FIG. 6 illustrates that the gate electrode GE of the thin film transistor TFT is the lower electrode CE1 of the storage capacitor Cst. According to some embodiments, the storage capacitor Cst may not overlap the thin film transistor TFT, and the gate electrode GE of the thin film transistor TFT and the lower electrode CE1 of the storage capacitor Cst may be separately formed. The storage capacitor Cst may be covered by a second interlayer insulating layer 207.

The lower electrode CE1 and/or the upper electrode CE2 of the storage capacitor Cst may include a conductive material including molybdenum (Mo), aluminum (Al), copper (Cu), titanium (Ti), or the like and may include a single layer or a multiple layer including the above material.

The first interlayer insulating layer 205 and the second interlayer insulating layer 207 may include an inorganic insulating material such as silicon oxide, silicon nitride, silicon oxynitride, aluminum oxide, titanium oxide, tantalum oxide, or hafnium oxide. The first interlayer insulating layer 205 and the second interlayer insulating layer 207 may include a single layer or a multiple layer including the above material.

The pixel circuit PC including the thin film transistor TFT and the storage capacitor Cst may be covered by a first organic insulating layer 209.

A pixel electrode 221 may be arranged on the pixel circuit PC, and the pixel electrode 221 may be electrically connected to the pixel circuit PC. For example, as illustrated in FIG. 6, a contact metal layer CM may be located between the thin film transistor TFT and the pixel electrode 221. The contact metal layer CM may be connected to the thin film transistor TFT through a contact hole formed in the first organic insulating layer 209, and the pixel electrode 221 may be arranged on a second organic insulating layer 211 and connected to the contact metal layer CM through a contact hole formed in the second organic insulating layer 211. The contact metal layer CM may include a conductive material including molybdenum (Mo), aluminum (Al), copper (Cu), titanium (Ti), or the like and may include a single layer or a multiple layer including the above material. According to some embodiments, the contact metal layer CM may include a multiple layer of Ti/Al/Ti.

The first organic insulating layer 209 and the second organic insulating layer 211 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. According to some embodiments, the first organic insulating layer 209 and the second organic insulating layer 211 may include polyimide.

The pixel electrode 221 may be formed on the second organic insulating layer 211. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. According to some embodiments, the pixel electrode 221 may further include a layer formed of ITO, IZO, ZnO, or $In_2O_3$ over/under the reflective layer. According to some embodiments, the pixel electrode 221 may include a three-layer structure of ITO/Ag/ITO.

An upper insulating layer 215 may be formed on the pixel electrode 221. The upper insulating layer 215 may include an opening 2150P exposing the upper surface of the pixel electrode 221 and may cover the edge of the pixel electrode 221. The upper insulating layer 215 may be a pixel definition layer defining a pixel. For example, the width of the opening 2150P exposing the upper surface of the pixel electrode 221 may correspond to the width of an emission area from which light is emitted, that is, the width of a pixel.

The upper insulating layer 215 may include an organic insulating material. For example, the upper insulating layer 215 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymers, a p-xylene-based polymer, a vinyl alcohol-based polymer, or any blend thereof.

A spacer 217 may be formed on the upper insulating layer 215. The spacer 217 may include an organic insulating material. The spacer 217 may include the same material as the upper insulating layer 215 and may be formed together in the same mask process as the upper insulating layer 215.

An intermediate layer 222 may include an emission layer 222b. The emission layer 222b may include a high-molecular or low-molecular weight organic material for emitting light of a certain color. The intermediate layer 222 may include at least one functional layer. The at least one functional layer may include an organic material. As illustrated in FIG. 6, the intermediate layer 222 may include a first functional layer 222a arranged under the emission layer 222b and/or a second functional layer 222c arranged on the emission layer 222b.

The first functional layer 222a may include a single layer or a multiple layer. For example, when the first functional layer 222a is formed of a high-molecular weight material, the first functional layer 222a may include a hole transport layer (HTL) having a single-layer structure. When the first functional layer 222a is formed of a low-molecular weight material, the first functional layer 222a may include a hole injection layer (HIL) and a hole transport layer (HTL).

The second functional layer 222c may include a single layer or a multiple layer. The second functional layer 222c may include an electron transport layer (ETL) and/or an electron injection layer (EIL).

The emission layer 222b of the intermediate layer 222 may be arranged for each pixel electrode 221 in the display area DA, while the first functional layer 222a and/or the second functional layer 222c may be formed to entirely cover the display area DA. Each of the first functional layer 222a and the second functional layer 222c may be a common layer and may cover a plurality of pixel electrodes 221.

An opposite electrode 223 may include a conductive material having a low work function. For example, the opposite electrode 223 may include a semi-transparent layer including Ag, Mg, Al, Pt, Pd, Au, Ni, Nd, Ir, Cr, lithium (Li), calcium (Ca), or an alloy thereof. Alternatively, the opposite electrode 223 may further include a layer such as ITO, IZO, ZnO, or $In_2O_3$ on the semi-transparent layer including the above-mentioned material. According to some embodiments, the opposite electrode 223 may include silver (Ag) and magnesium (Mg). The opposite electrode 223 may be formed to entirely cover the display area DA. The opposite electrode 223 may be a common layer and may cover a plurality of pixel electrodes 221.

An organic light emitting diode OLED including the pixel electrode 221, the intermediate layer 222, and the opposite electrode 223 may be covered by a thin film encapsulation layer 300. The thin film encapsulation layer 300 may include at least one organic encapsulation layer and at least one inorganic encapsulation layer, and according to some embodiments, as illustrated in FIG. 6, the thin film encapsulation layer 300 may include first and second inorganic encapsulation layers 310 and 330 and an organic encapsulation layer 320 therebetween. According to some embodiments, the number of organic encapsulation layers, the number of inorganic encapsulation layers, and the stacking order thereof may be changed.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or a multiple layer including the above material. The organic encapsulation layer 320 may include a polymer-based material. The polymer-based material may include polymethyl methacrylate, acrylic resin such as polyacrylic acid, epoxy resin, polyimide, polyethylene, or the like. According to some embodiments, the organic encapsulation layer 320 may include an acrylate polymer.

The first inorganic encapsulation layer 310 and the second inorganic encapsulation layer 330 may have different materials. For example, the first inorganic encapsulation layer 310 may include silicon oxynitride, and the second inorganic encapsulation layer 330 may include silicon nitride. The first inorganic encapsulation layer 310 and the second inorganic encapsulation layer 330 may have different thicknesses. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the first inorganic encapsulation layer 310 and the second inorganic encapsulation layer 330 may have the same thickness.

An input sensing layer 40 may be arranged on the thin film encapsulation layer 300. The input sensing layer 40 may include first insulating layers 41a and 41b, a first conductive layer CML1, a second insulating layer 43, a second conductive layer CML2, and a third insulating layer 45.

The first insulating layers 41a and 41b may include a first sub insulating layer 41a and a second sub insulating layer 41b. The first sub insulating layer 41a and the second sub insulating layer 41b may include an inorganic insulating material such as silicon oxide, silicon nitride, or silicon oxynitride.

The first conductive layer CML1 and the second conductive layer CML2 may include a conductive material, for example, each metal. For example, the first conductive layer CML1 and the second conductive layer CML2 may include molybdenum (Mo), aluminum (Al), copper (Cu), titanium (Ti), or the like and may be formed as a single layer or a multiple layer including the above material. According to some embodiments, each of the first conductive layer CML1 and the second conductive layer CML2 may have a structure in which a titanium layer, an aluminum layer, and a titanium layer are sequentially stacked (Ti/Al/Ti).

The first conductive layer CML1 and/or the second conductive layer CML2 may include a plurality of touch electrodes for sensing a touch input. According to some embodiments, the input sensing layer 40 may include touch electrodes extending in the x direction and touch electrodes extending in the y direction in the plan view, and the touch electrodes may be configured to sense an input by a mutual capacitance method and may be provided in the first conductive layer CML1 and/or the second conductive layer CML2. According to some embodiments, the touch electrode may be configured to sense an input by a self capacitance method and may be provided in the first conductive layer CML1 or the second conductive layer CML2.

A second insulating layer 43 may be arranged between the first conductive layer CML1 and the second conductive layer CML2. The second insulating layer 43 may include an inorganic insulating material such as silicon oxide, silicon nitride, or silicon oxynitride.

A third insulating layer 45 may be a type of planarization insulating layer and may include an organic insulating material. For example, the third insulating layer 45 may include a polymer-based material. The polymer-based material may be transparent. For example, the third insulating layer 45 may include silicon-based resin, acryl-based resin, epoxy-based resin, polyimide, and/or polyethylene.

FIG. 6 illustrates that the input sensing layer 40 includes the first conductive layer CML1 and the second conductive layer CML2; however, according to some embodiments, the input sensing layer 40 may include any one of the first conductive layer CML1 and the second conductive layer CML2.

Next, as for the intermediate area MA of FIG. 6, the first organic insulating layer 209 and the second organic insulating layer 211 may extend to the intermediate area MA and may be spaced apart from the first partition PW1 described below. Like the first organic insulating layer 209 and the second organic insulating layer 211, the inorganic insulating layer(s) on the display area DA, for example, the gate insulating layer 203, the first interlayer insulating layer 205, and the second interlayer insulating layer 207, may also extend to the intermediate area MA. The gate insulating layer 203, the first interlayer insulating layer 205, and the second interlayer insulating layer 207 may be spaced apart from the first partition PW1.

As illustrated in FIGS. 6 and 7A, edges 203e, 205e, and 207e of the gate insulating layer 203, the first interlayer insulating layer 205, and the second interlayer insulating layer 207 may be covered by the first organic insulating layer 209, and an edge 209e of the first organic insulating layer 209 may be covered by the second organic insulating layer 211.

A portion (hereinafter referred to as a bypass portion) of the data line DL located in the intermediate area MA, which has been described above with reference to FIG. 5, may be located on the first organic insulating layer 209 or the second organic insulating layer 211. For example, as illustrated in FIGS. 6 and 7A, bypass portions DL-C of the data line may be alternately arranged on the first organic insulating layer 209 and the second organic insulating layer 211. One of the bypass portions DL-C of two adjacent data lines may be arranged on the first organic insulating layer 209 and the other one may be arranged on the second organic insulating layer 211. According to some embodiments, the bypass portions DL-C of the data lines may be arranged on the same layer. For example, the bypass portions DL-C of all data lines may be arranged on the first organic insulating layer 209 or on the second organic insulating layer 211.

A structure including a protrusion PS and a relatively concave valley VY may be arranged on the first and second organic insulating layers 209 and 211. The structure including the protrusion PS and the valley VY may overlap the bypass portions DL-C of the data lines. For example, at least one of the bypass portions DL-C of the data lines may overlap the protrusion PS or the valley VY.

The protrusion PS and the valley VY may be alternately arranged as illustrated in FIG. 7A. For example, a valley VY may be arranged between adjacent protrusions PS, and a protrusion PS may be arranged between adjacent valleys VY. The structure including the protrusion PS and the valley VY may be formed on at least one insulating layer ISL on the second organic insulating layer 211, for example, a layer 217L including the upper insulating layer 215 and the spacer 21.

A portion of the organic encapsulation layer 320 may be in a concave space corresponding to the valley VY, and the volume of the organic encapsulation layer 320 may be sufficiently secured through the structure of the valley VY. As a comparative example of the disclosure, when there is no valley (VY) structure, it may be difficult to sufficiently secure the thickness of the organic encapsulation layer 320 covering the area where the bypass portions DL-C of the data lines are arranged, due to the flowability of the monomer injected by an inkjet method. However, in the present embodiments, by forming a structure including the valley VY described above, the volume of the monomer accommodated in the valley VY may be improved and thus the thickness of the organic encapsulation layer 320 may be sufficiently secured.

The valley VY and the protrusion PS may have a closed-loop shape surrounding the opening 10H of the display panel 10 in the plan view as illustrated in FIG. 7B. As illustrated in FIG. 6, because the opening 100H is also formed in the substrate 100 corresponding to the opening 10H of the display panel 10, "the opening area OA," "the opening 10H of the display panel 10," and "the opening 100H of the substrate 100" may be interchangeably used in the specification. For example, "surrounding the opening 10H of the display panel 10" may represent surrounding the opening 100H of the substrate 100.

One or more partitions may be arranged in the intermediate area MA and may be arranged closer to the opening 10H of the display panel 10 than the valley VY and the protrusion PS described above. In this regard, FIGS. 6 and 7B illustrate that the first partition PW1 and the second partition PW2 are arranged closer to the opening 10H than the valley VY and the protrusion PS.

The first partition PW1 and the second partition PW2 may be arranged to be spaced apart from each other. The first partition PW1 may be relatively adjacent to the display area DA, and the second partition PW2 may be relatively adjacent to the opening area OA. Each of the first partition PW1 and the second partition PW2 may have a closed-loop shape surrounding the opening area OA as illustrated in FIG. 7B.

The first partition PW1 and the second partition PW2 may include an insulating material. For example, the first partition PW1 and the second partition PW2 may include an organic insulating material, may be formed together in the process of forming a plurality of insulating material layers arranged in the display area DA, and may include the same material as the plurality of insulating material layers.

The first partition PW1 may include a plurality of first sub partition layers 1110, 1120, and 1130. The plurality of first sub partition layers 1110, 1120, and 1130 may include a (1-1)th sub partition layer 1110, a (1-2)th sub partition layer 1120, and a (1-3)th sub partition layer 1130 that are sequentially stacked. The (1-1)th sub partition layer 1110 may include the same material as the second organic insulating layer 211, and the (1-2)th sub partition layer 1120 may include the same material as the upper insulating layer 215, and the (1-3)th sub partition layer 1130 may include the same material as the spacer 217.

The second partition PW2 may include a plurality of second sub partition layers 1210, 1220, 1230, and 1240. The plurality of second sub partition layers 1210, 1220, 1230, and 1240 may include a (2-1)th sub partition layer 1210, a (2-2)th sub partition layer 1220, a (2-3)th sub partition layer 1230, and a (2-4)th sub partition layer 1240 that are sequentially stacked.

The (2-1)th sub partition layer 1210 may include the same material as the gate insulating layer 203 and the first and second interlayer insulating layers 205 and 207 or may include the same material as the first organic insulating layer 209. The (2-2)th sub partition layer 1220 may include the same material as the second organic insulating layer 211, and the (2-3)th sub partition layer 1230 may include the same material as the upper insulating layer 215, and the (2-4)th sub partition layer 1240 may include the same material as the spacer 217.

The first partition PW1 and the second partition PW2 may be located on an inorganic insulating material, for example, the buffer layer 201. The first partition PW1 and the second partition PW2 may have a shape in which the lower width is greater than the upper width thereof.

The first partition PW1 and the second partition PW2 may have different heights. For example, as illustrated in FIG. 6, a height H2 of the second partition PW2 may be greater than a height H1 of the first partition PW1. In other words, the vertical distance from the upper surface of the substrate 100 to the upper surface of the second partition PW2 may be greater than the vertical distance from the upper surface of the substrate 100 to the upper surface of the first partition PW1.

FIG. 6 illustrates that the first partition PW1 and the second partition PW2 have different heights; however, according to some embodiments, the first second partition PW1 and the second partition PW2 may have substantially the same height. In other words, the vertical distance from the upper surface of the substrate 100 to the upper surface of the first partition PW1 and the vertical distance from the upper surface of the substrate 100 to the upper surface of the second partition PW2 may be substantially equal.

At least one partition described above, for example, the first partitions PW1 and the second partitions PW2, may control the flow of the material of the organic encapsulation layer 320 in the process of forming the thin film encapsulation layer 300. For example, the organic encapsulation layer 320 may be formed by applying a monomer through an inkjet process or the like and then curing the monomer. In this case, the partition may sufficiently secure the thickness of the organic encapsulation layer 320 by controlling the flow of the monomer. According to some embodiments, as illustrated in FIG. 6, an edge 320e of the organic encapsulation layer 320 may be located on one side of the first partition PW1.

The first partition PW1 and the second partition PW2 may be formed before the formation of the first inorganic encapsulation layer 310, and thus, the first partition PW1 and the second partition PW2 may be covered by the first inorganic encapsulation layer 310. Because the edge 320e of the organic encapsulation layer 320 is located on one side of any one partition, for example, the first partition PW1, the second inorganic encapsulation layer 330 may directly contact the first inorganic encapsulation layer 310 in the intermediate area MA.

For example, the first inorganic encapsulation layer 310 and the second inorganic encapsulation layer 330 may directly contact each other in an area between the first partition PW1 and the opening 10H of the display panel 10. For example, the first inorganic encapsulation layer 310 and the second inorganic encapsulation layer 330 may directly contact each other on the first partition PW1, may directly contact each other on the second partition PW2, may directly contact each other between the first partition PW1 and the second partition PW2, and may directly contact each other between the second partition PW2 and the opening area OA (or the opening 10H).

The insulating layers of the input sensing layer 40, for example, the first insulating layers 41a and 41b, the second insulating layer 43, and the third insulating layer 45, may also extend to cover the intermediate area MA. The first sub insulating layer 41a and the second sub insulating layer 41b among the first insulating layers 41a and 41b may directly contact each other in the display area DA; however, in the intermediate area MA, the first sub insulating layer 41a and the second sub insulating layer 41b may be spaced apart from each other in the thickness direction (z direction) by a planarization insulating layer 47 located between the first sub insulating layer 41a and the second sub insulating layer 41b.

The planarization insulating layer 47 may be arranged to cover the intermediate area MA. The planarization insulating layer 47 may be located only in the intermediate area MA. The planarization insulating layer 47 may have a width ranging from a first edge 47E1 to a second edge 47E2, and the planarization insulating layer 47 may have a closed-loop shape entirely surrounding the opening 10H of the display panel 10 as illustrated in FIG. 7B. The first edge 47E1 of the planarization insulating layer 47 may face the opening 10H of the display panel 10, and the second edge 47E2 of the planarization insulating layer 47 may be adjacent to the display area DA. A portion of the planarization insulating layer 47 adjacent to the display area DA may overlap a portion of the organic encapsulation layer 320 while covering the edge 320e of the organic encapsulation layer 320. The second inorganic encapsulation layer 330 and the first sub insulating layer 41a may be located between the above portion of the planarization insulating layer 47 and the organic encapsulation layer 320 overlapping therewith.

The planarization insulating layer 47 may include an organic insulating material. For example, the planarization insulating layer 47 may include a polymer-based material. The polymer-based material may be transparent. For example, the planarization insulating layer 47 may include silicon-based resin, acryl-based resin, epoxy-based resin, polyimide, and/or polyethylene. According to some embodiments, the planarization insulating layer 47 may include the same material as the third insulating layer 45 of the input sensing layer 40.

At least one organic material layer included in the intermediate layer 222, for example, the first functional layer 222a and/or the second functional layer 222c, may be formed to entirely cover the display area DA and may extend to the intermediate area MA. Likewise, the opposite electrode 223 formed to entirely cover the display area DA may extend to the intermediate area MA.

The first functional layer 222a, the second functional layer 222c, and the opposite electrode 223 may extend to the intermediate area MA and may be spaced apart from the opening area OA by a certain distance. For example, the first functional layer 222a, the second functional layer 222c, and the opposite electrode 223 may extend beyond an edge 211e of the second organic insulating layer 211, and each of an edge 222ae of the first functional layer 222a, an edge 222ce of the second functional layer 222c, and an edge 223e of the opposite electrode 223 may be located between the display area DA and the first partition PW1. For example, the edge 222ae of the first functional layer 222a, the edge 222ce of the second functional layer 222c, and the edge 223e of the opposite electrode 223 may be located between the edge 211e of the second organic insulating layer 211 and the first partition PW1. The edge 222ae of the first functional layer 222a, the edge 222ce of the second functional layer 222c, and the edge 223e of the opposite electrode 223 may be covered by an organic insulating material layer, for example, the organic encapsulation layer 320.

As a comparative example of the disclosure, when the first functional layer 222a, the second functional layer 222c, and the opposite electrode 223 entirely cover the intermediate area MA, the respective edges 222ae, 222ce, and 223e of the first functional layer 222a, the second functional layer 222c, and the opposite electrode 223 may be exposed toward the opening 10H of the display panel 10. In the case of having the same structure as in the comparative example, moisture may flow into the display area DA through the first functional layer 222a, the second functional layer 222c, and the opposite electrode 223 themselves exposed toward the opening 10H of the display panel 10 or the interface therebetween and thus the organic light emitting diode OLED may be damaged.

However, according to embodiments, by removing a portion adjacent to the opening area OA among a stack of the first functional layer 222a, the second functional layer 222c, and the opposite electrode 223 deposited in the intermediate area MA, the edges 222ae, 222ce, and 223e of the first functional layer 222a, the second functional layer 222c, and the opposite electrode 223 may be spaced apart from the opening area OA, that is, the opening 10H of the display panel 10, thereby preventing or reducing the inflow of the moisture or other contaminants described above. The stack of the first functional layer 222a, the second functional layer 222c, and the opposite electrode 223 adjacent to the opening area OA may be removed by a laser lift-off process. By the laser lift-off process, the layer corresponding to the first functional layer 222a and the second functional layer 222c may not be in the area between the edges 222ae and 222ce of the first functional layer 222a and the second functional layer 222c and the opening 10H, and likewise, the layer corresponding to the opposite electrode 223 may not be in the area between the edge 223e of the opposite electrode 223 and the opening 10H.

The edges 222ae, 222ce, and 223e of the first functional layer 222a, the second functional layer 222c, and the opposite electrode 223 may have different positions. For example, the edge 223e of the opposite electrode 223 may be closer to the opening area OA than the edges 222ae and 222ce of the first functional layer 222a and the second functional layer 222c. Alternatively, the edges 222ae and/or 222ce of the first functional layer 222a and/or the second functional layer 222c may be closer to the opening area OA than the edge 223e of the opposite electrode 223. The edge 223e of the opposite electrode 223 may have an irregular shape.

Referring to FIGS. 6 and 8A to 8C, a portion 223ep of the opposite electrode 223 facing the opening 10H of the display panel 10 and/or the opening 100H of the substrate 100 may protrude further than the edges 222ae and 222ce of the first functional layer 222a and the second functional layer 222c. For example, the portion 223ep of the opposite electrode 223 facing the opening 10H of the display panel 10 and/or the opening 100H of the substrate 100 may be closer to the opening 10H of the display panel 10 and/or the opening 100H of the substrate 100 than the edges 222ae and 222ce of the first functional layer 222a and the second functional layer 222c.

The edge 223e facing the opening 10H of the display panel 10 may correspond to an end of the portion 223ep of the opposite electrode 223 described above. The portion 223ep of the opposite electrode 223 may include a burr formed by a laser lift-off process and may have various shapes as illustrated in FIGS. 8A to 8C.

Figure 8A:
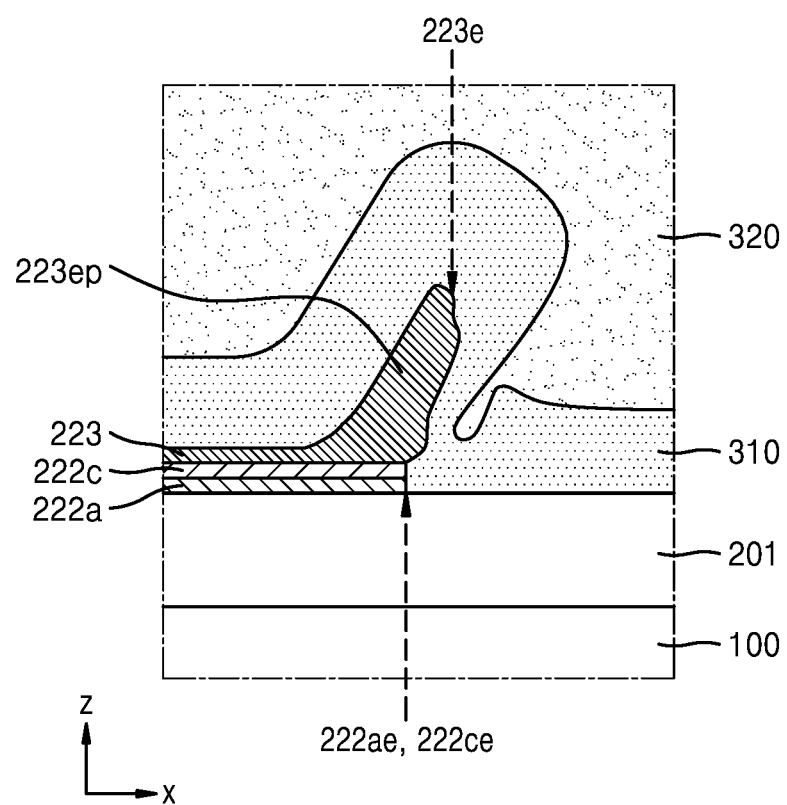
FIG. 8A to 8C are enlarged cross-sectional views of the region VIII of FIG. 6.

According to some embodiments, as illustrated in FIG. 8A, the portion 223ep of the opposite electrode 223 may extend in an oblique direction away from the upper surface of the substrate 100, and the cross-sectional shape thereof may have a locally irregular bump. According to some embodiments, as illustrated in FIG. 8B, the portion 223ep of the opposite electrode 223 may extend beyond the edges 222ae and 222ce of the first functional layer 222a and the second functional layer 222c, and the cross-section thereof may have an irregular bump. Alternatively, the portion 223ep of the opposite electrode 223 may have various shapes such as having a shape bent toward the top surface of the substrate 100 as illustrated in FIG. 8C.

Figure 8B:
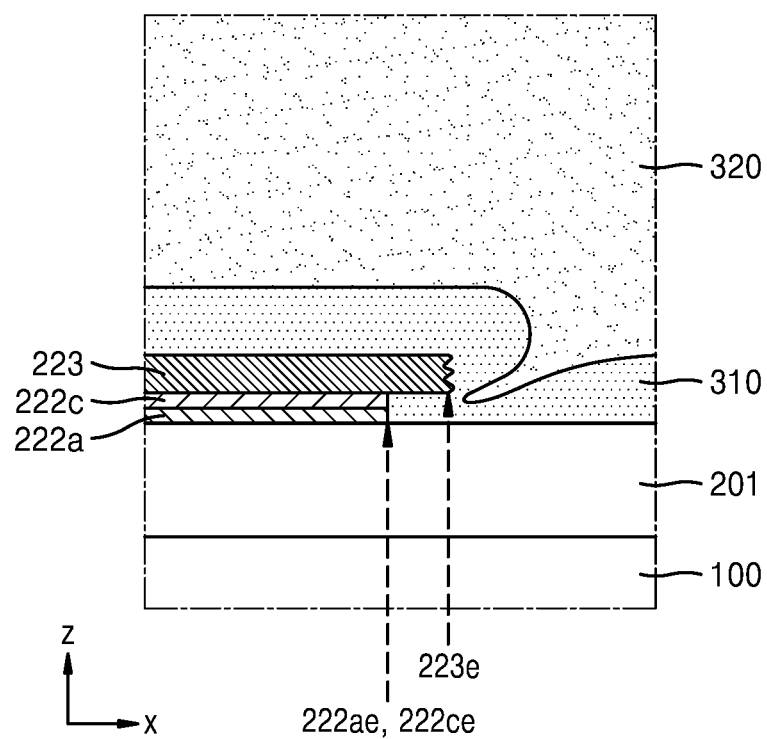
Figure 8C:
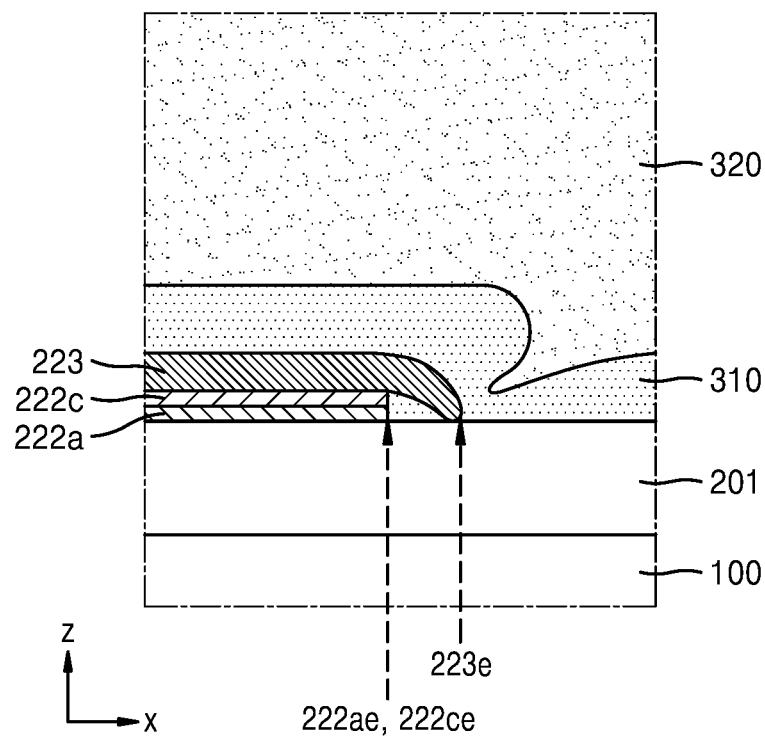

As illustrated in FIGS. 8A to 8C, the thickness of the first inorganic encapsulation layer 310 formed on the opposite electrode 223 may not be uniform due to the irregular shape of the portion 223ep of the opposite electrode 223. In this case, there may be a problem in that a crack may occur in the first inorganic encapsulation layer 310 and the crack may be transmitted to the display area DA; however, according to embodiments, because the edge 223e of the opposite electrode 223 (for example, burr) are covered by the organic encapsulation layer 320, the above problem may be prevented or reduced. According to some embodiments, as described in FIGS. 8a and 8B, the edge 222ae of the first functional layer 222a, the edge 222ce of the second functional layer 222c, and the edge 223e of the opposite electrode 223 may be covered by the organic encapsulation layer 320.

FIGS. 9A to 9E are cross-sectional views illustrating a display panel manufacturing process according to some embodiments.

Figure 9A:
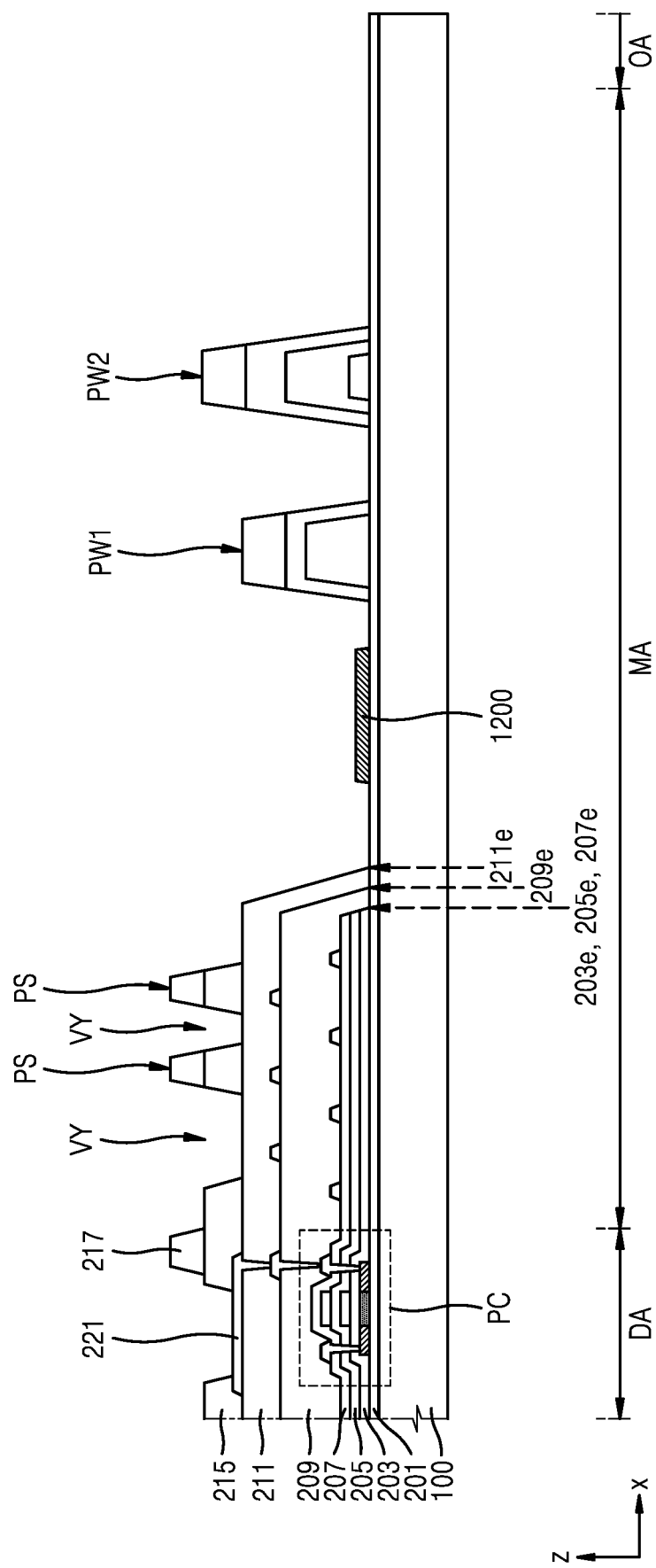

First, referring to FIG. 9A, a pixel circuit PC, a pixel electrode 221 on the pixel circuit PC, and at least one partition may be formed on a substrate 100. Before the forming of the pixel circuit PC, a buffer layer 201 may be formed to entirely cover the upper surface of the substrate 100. Thereafter, a semiconductor layer of a thin film transistor, a gate insulating layer 203, a gate electrode of the thin film transistor and a lower electrode of a storage capacitor, a first interlayer insulating layer 205, an upper electrode of the storage capacitor, and a second interlayer insulating layer 207, a source electrode and a drain electrode, a first organic insulating layer 209, a contact metal layer, and a second organic insulating layer 211 may be sequentially formed.

While the buffer layer 201 may entirely cover the substrate 100, portions corresponding to one area of the intermediate area MA among the insulating layers on the buffer layer 201 may be removed. For example, a portion of each of the gate insulating layer 203, the first interlayer insulating layer 205, the second interlayer insulating layer 207, the first organic insulating layer 209, and/or the second organic insulating layer 211 located in the opening area OA and some area of the intermediate area MA adjacent to the opening area OA may be removed. Thus, as illustrated in FIG. 9A, the edges 203e, 205e, and 207e of the gate insulating layer 203, the first interlayer insulating layer 205, and/or the second interlayer insulating layer 207 facing the opening area OA and/or adjacent to the opening area OA may be spaced apart from the first partition PW1 and may be covered by the first organic insulating layer 209. Similarly, the edges 209e and 211e of the first organic insulating layer 209 and the second organic insulating layer 211 facing the opening area OA and/or adjacent to the opening area OA may also be spaced apart from the first partition PW1, and the edge 209e of the first organic insulating layer 209 may be covered by the second organic insulating layer 211.

A pixel electrode 221 may be formed on the second organic insulating layer 211, and an upper insulating layer 215 and a spacer 217 may be formed on the pixel electrode 221. During the process of forming the upper insulating layer 215 and the spacer 217, portions of the layer including the upper insulating layer 215 and the spacer 217 may be removed and thus a structure including a valley VY and a protrusion PS may be formed in the intermediate area MA.

At least one partition located in the intermediate area MA may be formed together when insulating material layers including an organic insulating material are formed in the display area DA. At least one partition, for example, the first and second partitions PW1 and PW2 may have a cross-sectional shape in which the lower width is greater than the upper width thereof. Each of the first and second partitions PW1 and PW2 may include a plurality of sublayers, and each sublayer may be formed together in the process of forming the first organic insulating layer 209, the second organic insulating layer 211, the upper insulating layer 215, and/or the spacer 217. Particular materials of the sublayers of the first and second partitions PW1 and PW2 may be the same as those described above with reference to FIG. 6.

A sacrificial layer 1200 may be arranged in the intermediate area MA. According to some embodiments, the sacrificial layer 1200 may be arranged between the display area DA and the first partition PW1. In this regard, FIG. 9A illustrates that the sacrificial layer 1200 is arranged between the edge 211e of the second organic insulating layer 211 and the first partition PW1. FIG. 9A illustrates one sacrificial layer 1200; however, according to some embodiments, a plurality of sacrificial layers 1200 may be arranged in the intermediate area MA to be spaced apart from each other.

The sacrificial layer 1200 may be formed in the intermediate area MA in the same process as the pixel electrode 221. The sacrificial layer 1200 may include the same material as the pixel electrode 221. For example, the sacrificial layer 1200 may include a metal and a transparent conductive oxide such as ITO/Ag/ITO.

Figure 9B:
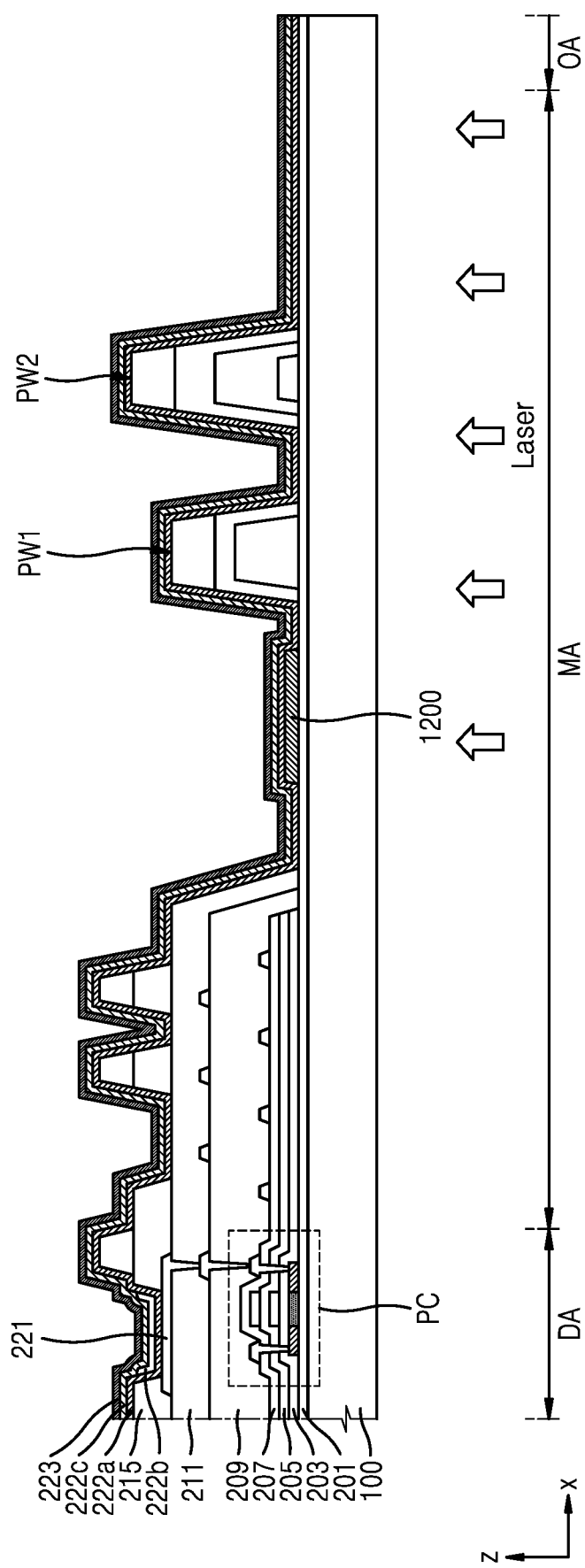

Thereafter, as illustrated in FIG. 9B, a first functional layer 222a, an emission layer 222b, a second functional layer 222c, and an opposite electrode 223 may be formed on the pixel electrode 221. The emission layer 222b may be formed to correspond to the pixel electrodes 221 arranged to be spaced apart from each other in the display area DA, while the first functional layer 222a, the second functional layer 222c, and the opposite electrode 223 may be entirely formed on the upper surface of the substrate 100 as illustrated in FIG. 9B.

When the first functional layer 222a, the second functional layer 222c, and the opposite electrode 223, which are common layers, entirely cover the upper surface of the substrate 100, because moisture may flow into the light emitting diode as described above, portions of the first functional layer 222a, the second functional layer 222c, and the opposite electrode 223 located in the opening area OA and some area of the intermediate area MA adjacent to the opening area OA may be removed by using a laser lift-off process.

Figure 9C:
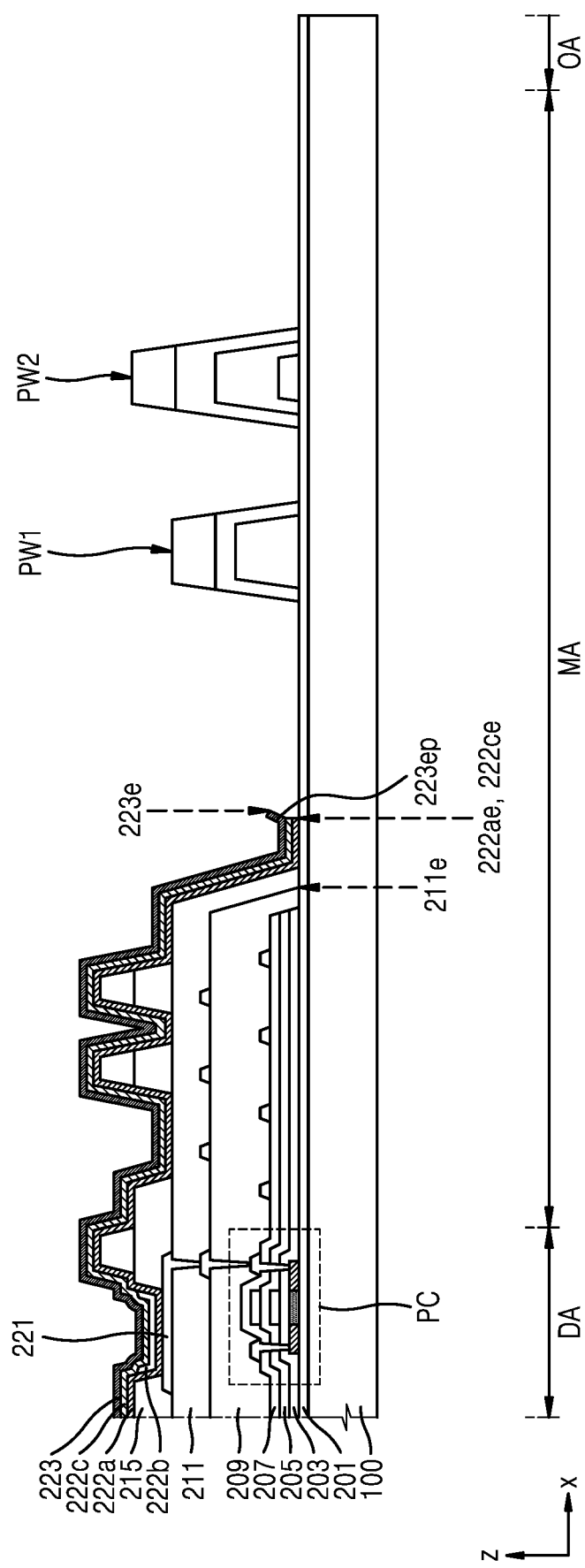

In this case, the sacrificial layer 1200 including a material having thermal conductivity like a metal may be heated to a certain temperature by absorbing a laser, and the first functional layer 222a, the second functional layer 222c, and/or the opposite electrode 223 on the sacrificial layer 1200 may be more effectively removed than the first functional layer 222a, the second functional layer 222c, and/or the opposite electrode 223 on another area where the sacrificial layer 1200 is not formed. Portions of the first functional layer 222a, the second functional layer 222c, and the opposite electrode 223 on another area where the sacrificial layer 1200 is not formed (e.g., a portion of the intermediate area and the opening area) may be removed by adjusting the irradiation time and output of the laser in a laser lift-off process. FIG. 9B illustrates one sacrificial layer 1200 on the substrate 100, however, embodiments according to the present disclosure are not limited thereto. According to some embodiments, a plurality of sacrificial layers 1200 are formed between the display area DA and the opening area OA on the substrate 100. Alternatively, a width of the sacrificial layer 1200 is greater than that of the sacrificial layer 1200 illustrated in FIG. 9B. Also, the sacrificial layer 1200 may also be removed. FIG. 9C illustrates that portions of the sacrificial layer 1200, the first functional layer 222a, the second functional layer 222c, and the opposite electrode 223 are removed by the above laser lift-off process. The edges 222ae, 222ce, and 223e of the first functional layer 222a, the second functional layer 222c, and the opposite electrode 223 may be located spaced apart from the opening area OA. The edges 222ae, 222ce, and 223e of the first functional layer 222a, the second functional layer 222c, and the opposite electrode 223 may be located between the edge 211e of the second organic insulating layer 211 and the first partition PW.

Figure 9D:
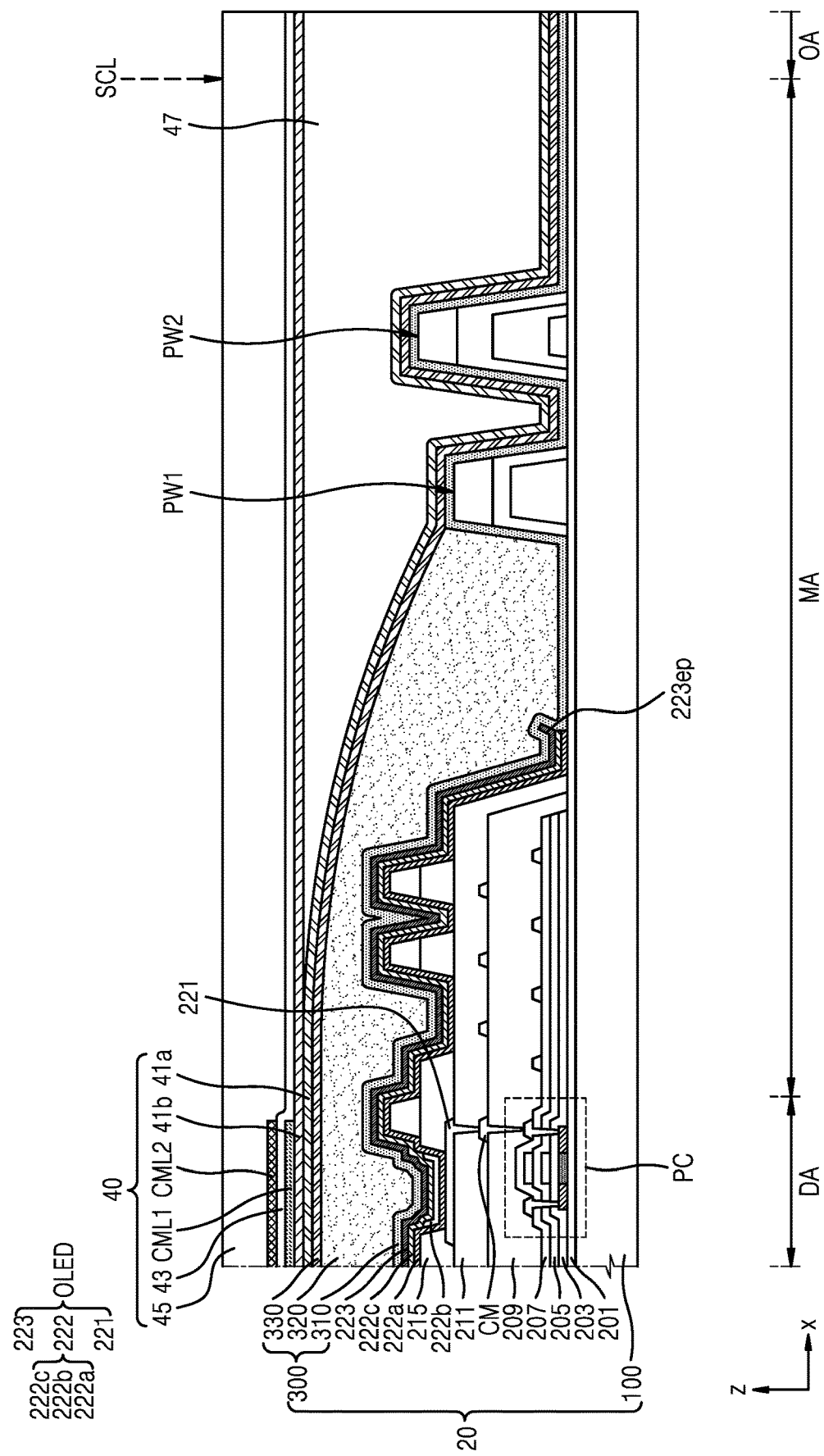

As a comparative example of the disclosure, when the sacrificial layer 1200 is arranged only on the right side of a third partition PW3, the edge 222ae of the first functional layer 222a, the edge 222ce of the second functional layer 222c, and the edge 223e of the opposite electrode 223 may be arranged between the third partition PW3 and the opening area OA. In this case, particles generated in the laser lift-off process may remain on a portion of the opposite electrode 223 remaining between the display area DA and the third partition PW3, and the particles may be a type of foreign substances and thus may degrade the quality of the first inorganic encapsulation layer 310 formed on the opposite electrode 223. However, as illustrated in FIG. 9D, the above problem may be minimized by performing a process by arranging the sacrificial layer 1200 between the display area DA and the first partition PW1 and covering the edge 223e of the opposite electrode 223 with the organic encapsulation layer 320. According to some embodiments, FIG. 9D illustrates that the edge 222ae of the first functional layer 222a, the edge 222ce of the second functional layer 222c, and the edge 223e of the opposite electrode 223 are covered by the organic encapsulation layer 320. Because the materials of the first and second functional layers 222a and 222c and the opposite electrode 223 are different from each other, even when the same laser is irradiated, the edges 222ae and 222ce of the first and second functional layers 222a and 222c and the edge 223e of the opposite electrode 223 may be located at different positions. For example, the edge 223e of the opposite electrode 223 may more extend toward the first partition PW1 than the edges 222ae and 222ce of the first and second functional layers 222a and 222c.

According to the laser lift-off process, an edge portion of the opposite electrode 223, that is, a portion 223ep of the opposite electrode facing the opening area OA, may include a burr, and a particular shape thereof may be the same as that described above with reference to FIGS. 8A to 8C.

Referring to FIG. 9D, a thin film encapsulation layer 300 and an input sensing layer 40 may be formed on the substrate 100 where the structure described with reference to FIG. 9C is formed.

A first inorganic encapsulation layer 310 of the thin film encapsulation layer 300 may be formed to entirely cover the substrate 100. The first inorganic encapsulation layer 310 may be formed by chemical vapor deposition or the like. In the structure described above with reference to FIG. 9C, because the sacrificial layer 1200 between adjacent partitions is removed, the first inorganic encapsulation layer 310 may directly contact the inorganic insulating layer thereunder, for example, the buffer layer 201.

The first inorganic encapsulation layer 310 may cover a portion 223ep of the opposite electrode 223 because it has relatively excellent step coverage. However, because the shape thereof is irregular, even when the first inorganic encapsulation layer 310 covers a portion 223ep of the opposite electrode 223, there may be a portion formed with a small thickness as illustrated in FIGS. 8A to 8C and a crack may occur relatively easily in the corresponding portion; however, because a portion 223ep of the opposite electrode 223 is covered by the organic encapsulation layer 320, the above problem may be minimized or prevented or reduced as described above.

The organic encapsulation layer 320 may be formed by applying a monomer through an inkjet method and then curing the monomer, and the organic encapsulation layer 320 may include a resin formed as the monomer is cured. A particular material of the organic encapsulation layer 320 may be the same as that described above.

The second inorganic encapsulation layer 330 may be formed on the organic encapsulation layer 320 and may be formed by chemical vapor deposition or the like, like the first inorganic encapsulation layer 310. The second inorganic encapsulation layer 330 may directly contact the first inorganic encapsulation layer 310 on the intermediate area MA and the opening area OA and may form a contact area between the inorganic materials to further reduce the possibility of moisture penetration.

Thereafter, a first sub insulating layer 41a may be formed and a planarization insulating layer 47 may be formed on the first sub insulating layer 41a. The planarization insulating layer 47 may be formed in the intermediate area MA and the opening area OA. While the organic encapsulation layer 320 may be arranged to cover the display area DA, the planarization insulating layer 47 may not cover the display area DA. During the manufacturing process illustrated in FIG. 9D, the planarization insulating layer 47 may be only in the intermediate area MA and the opening area OA.

Next, a second sub insulating layer 41b may be formed, and a first conductive layer CML1, a second insulating layer 43, a second conductive layer CML2, and a third insulating layer 45 may be sequentially formed.

Thereafter, when the opening area OA is cut along a cutting line SCL by using a method such as laser cutting, an opening 10H penetrating the display panel 10 may be formed in opening area OA as illustrated in FIG. 9E.

Figure 10:
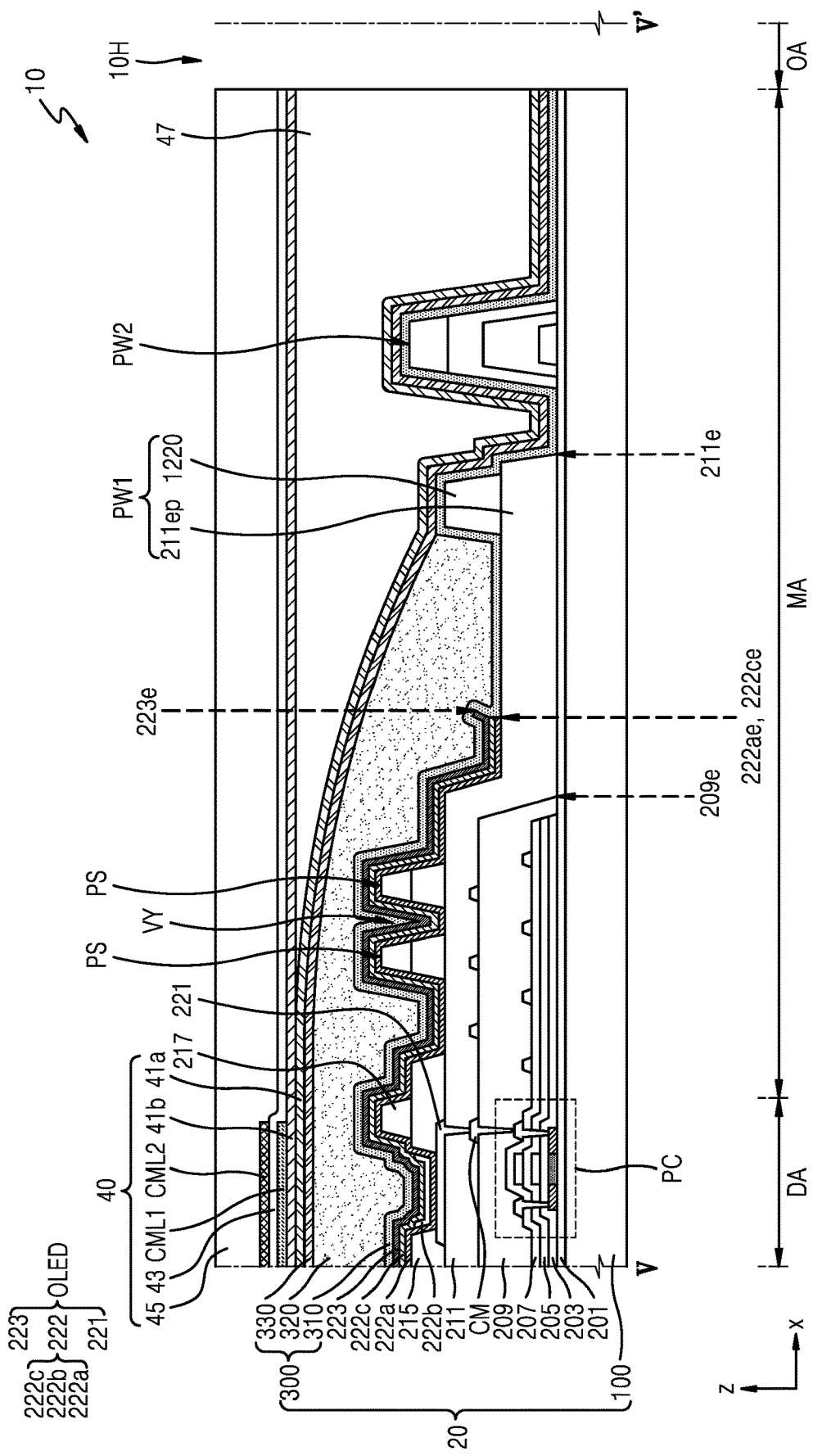
FIG. 10 is a cross-sectional view schematically illustrating a display panel according to some embodiments, which may correspond to a cross-section taken along the line V-V' of FIG. 5.

FIG. 10 is a cross-sectional view schematically illustrating a display panel according to some embodiments, which may correspond to a cross-section taken along the line V-V' of FIG. 5.

According to the embodiments described above with reference to FIGS. 6 to 8, the edge 211e of the second organic insulating layer 211 is spaced apart from the first partition PW1; however, according to some embodiments, the second organic insulating layer 211 may extend under the first partition PW1 and may form a portion of the first partition PW1. Other features other than the above structure may be the same as those described above with reference to FIG. 6, and thus, the difference therebetween will be mainly described below.

Referring to FIG. 10, the second organic insulating layer 211 may extend toward the opening area OA while covering the edge 209e of the first organic insulating layer 209. The second organic insulating layer 211 may extend toward the second partition PW2 to pass through a portion of the first partition PW1. In this case, the edge 211e of the second organic insulating layer 211 and the second partition PW2 may be spaced apart from each other. The edge 211e of the second organic insulating layer 211 may be closer to the second partition PW2 than the edge 320e of the organic encapsulation layer 320.

A portion 211ep of the second organic insulating layer 211 may form a portion of the first partition PW1. A portion 211ep of the second organic insulating layer 211 may be a portion adjacent to the edge 211e of the second organic insulating layer 211 and may correspond to one of a plurality of sublayers forming the first partition PW1. Another sublayer 1220 among the plurality of sublayers forming the first partition PW1 may be located on a portion 211ep of the second organic insulating layer 211 and may include the same material as the upper insulating layer 215 and/or the spacer 217.

The functional layers including the organic material arranged in the display area DA, for example, the first and second functional layers 222a and 222c, may extend toward the intermediate area MA and may be arranged closer to the display area DA than the first partition PW1 as described above with reference to FIG. 6. Likewise, the opposite electrode 223 may also extend toward the intermediate area MA and may be arranged closer to the display area DA than the first partition PW1. Also, the positions of the edges 223e of the opposite electrode 223 and the edges 222ae and 222ce of the first and second functional layers 222a and 222c, the feature of the opposite electrode 223 including a burr, and the like may be the same as those described above with reference to FIG. 6.

However, because the second organic insulating layer 211 extends toward the opening 10H to form a portion of the first partition PW1, the edges 222*ae* and 222*ce* of the first and second functional layers 222*a* and 222*c* and the edge 223*e* of the opposite electrode 223 may be located on the second organic insulating layer 211.

Figure 11A:
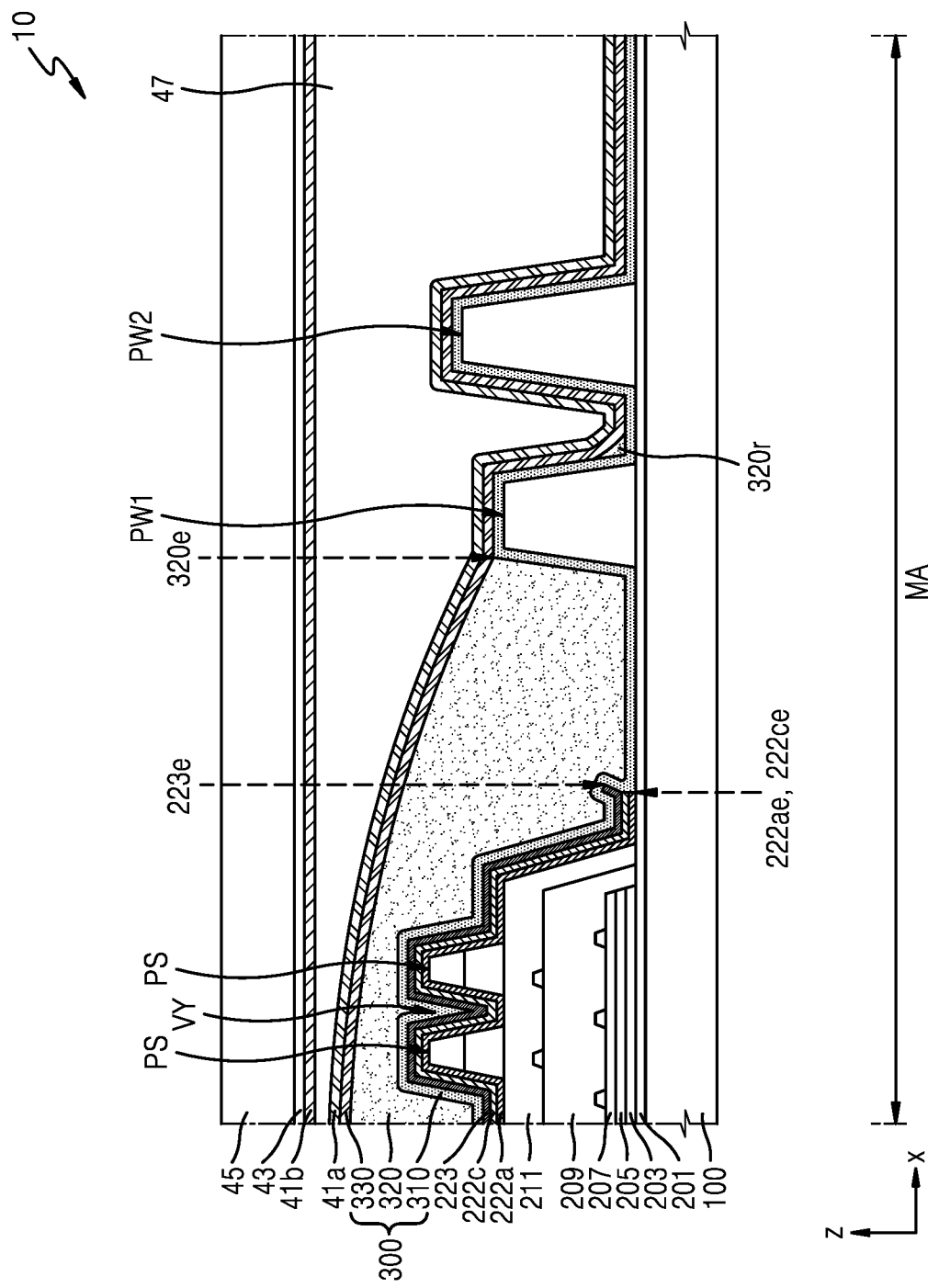
FIG. 11A to 11C are cross-sectional views schematically illustrating an intermediate area of a display panel according to some embodiments.
Figure 11B:
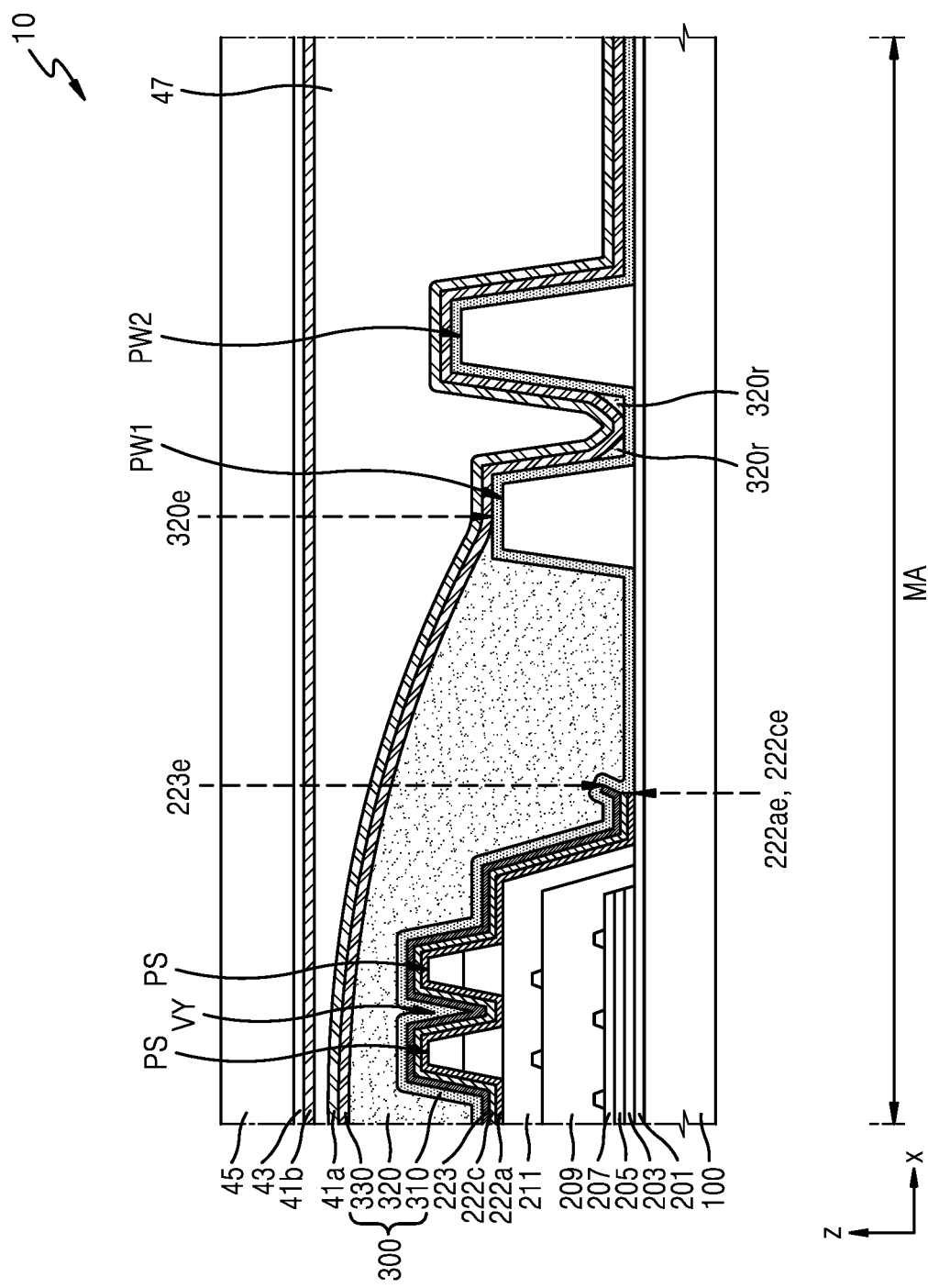
Figure 11C:
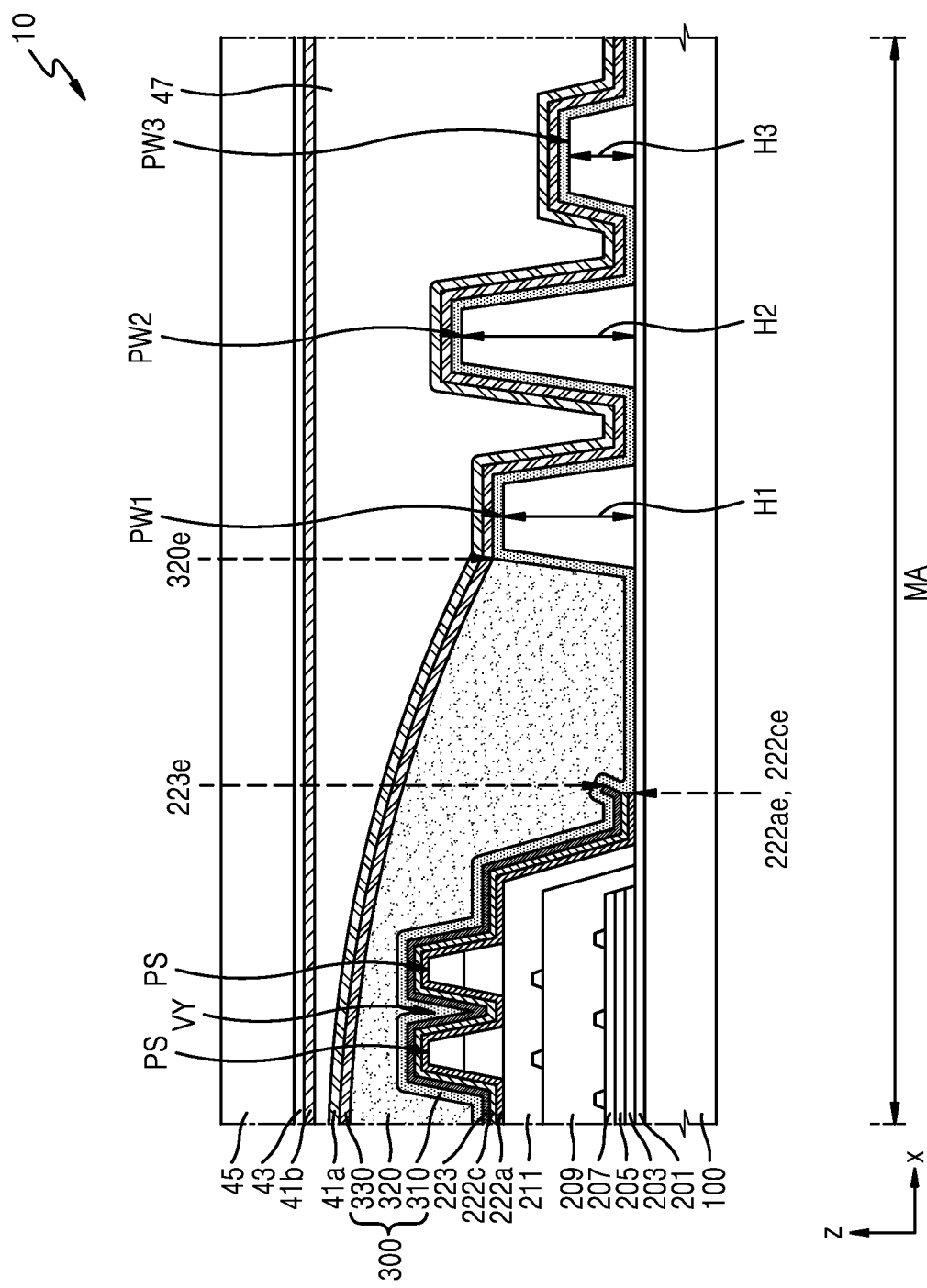

FIG. 11A to 11C are cross-sectional views schematically illustrating an intermediate area of a display panel according to some embodiments.

According to the embodiments described above with reference to FIGS. 6 to 10, the first inorganic encapsulation layer 310 and the second inorganic encapsulation layer 330 directly contact each other without an organic material therebetween in the area between the first partition PW1 and the second partition PW2; however, according to some embodiments, a residual organic material may be in the area between the first partition PW1 and the second partition PW2.

According to some embodiments, as illustrated in FIG. 11A, the edge 320*e* of the organic encapsulation layer 320 may be located on one side of the first partition PW1 (e.g., the other side of the first partition PW1 facing the second partition PW2) as in the embodiments described above.

In the area between the first partition PW1 and the second partition PW2, an organic residue 320*r* may be arranged on the other side of the first partition PW1. The organic residue 320*r* may be formed as some monomer moves between the first partition PW1 and the second partition PW2 according to the flow of the injected monomer when the organic encapsulation layer 320 is formed. The organic residue 320*r* may include the same material as the organic encapsulation layer 320.

According to some embodiments, the edge 320*e* of the organic encapsulation layer 320 illustrated in FIG. 11B may be located on the upper surface of the first partition PW1 unlike the illustration of FIG. 11A. In the area between the first partition PW1 and the second partition PW2, the organic residues 320*r* may be arranged spaced apart from each other. One organic residue 320*r* may be arranged adjacent to the first partition PW1, the other organic residue 320*r* may be arranged adjacent to the second partition PW2, and the organic residues 320*r* may be spaced apart from each other.

The first inorganic encapsulation layer 310 and the second inorganic encapsulation layer 330 may locally directly contact each other between the organic residues 320*r* spaced apart from each other in the area between the first partition PW1 and the second partition PW2. For example, the first portions of the first inorganic encapsulation layer 310 and the second inorganic encapsulation layer 330 may not directly contact each other by the locally-arranged organic residue 320*r*, but the second portions thereof may directly contact each other between the organic residue 320*r* adjacent to the first partition PW1 and the organic residue 320*r* adjacent to the second partition PW2.

According to the embodiments described above with reference to FIGS. 6 to 11B, the display panel 10 includes two partitions; however, as illustrated in FIG. 11C, the display panel 10 may include three or more partitions.

Referring to FIG. 11C, the third partition PW3 may be arranged closer to the opening area, that is, the opening 10H of the display panel 10 (see FIG. 6), than the first partition PW1 and the second partition PW2. The first to third partitions PW1, PW2, and PW3 may have different heights.

For example, a height H2 of the second partition PW2 may be greater than a height H1 of the first partition PW1 and a height H3 of the third partition PW3, and the height H1 of the first partition PW1 may be greater than the height H3 of the third partition PW3. A plurality of partitions may be used to monitor the position of the organic encapsulation layer 320.

Figure 12:
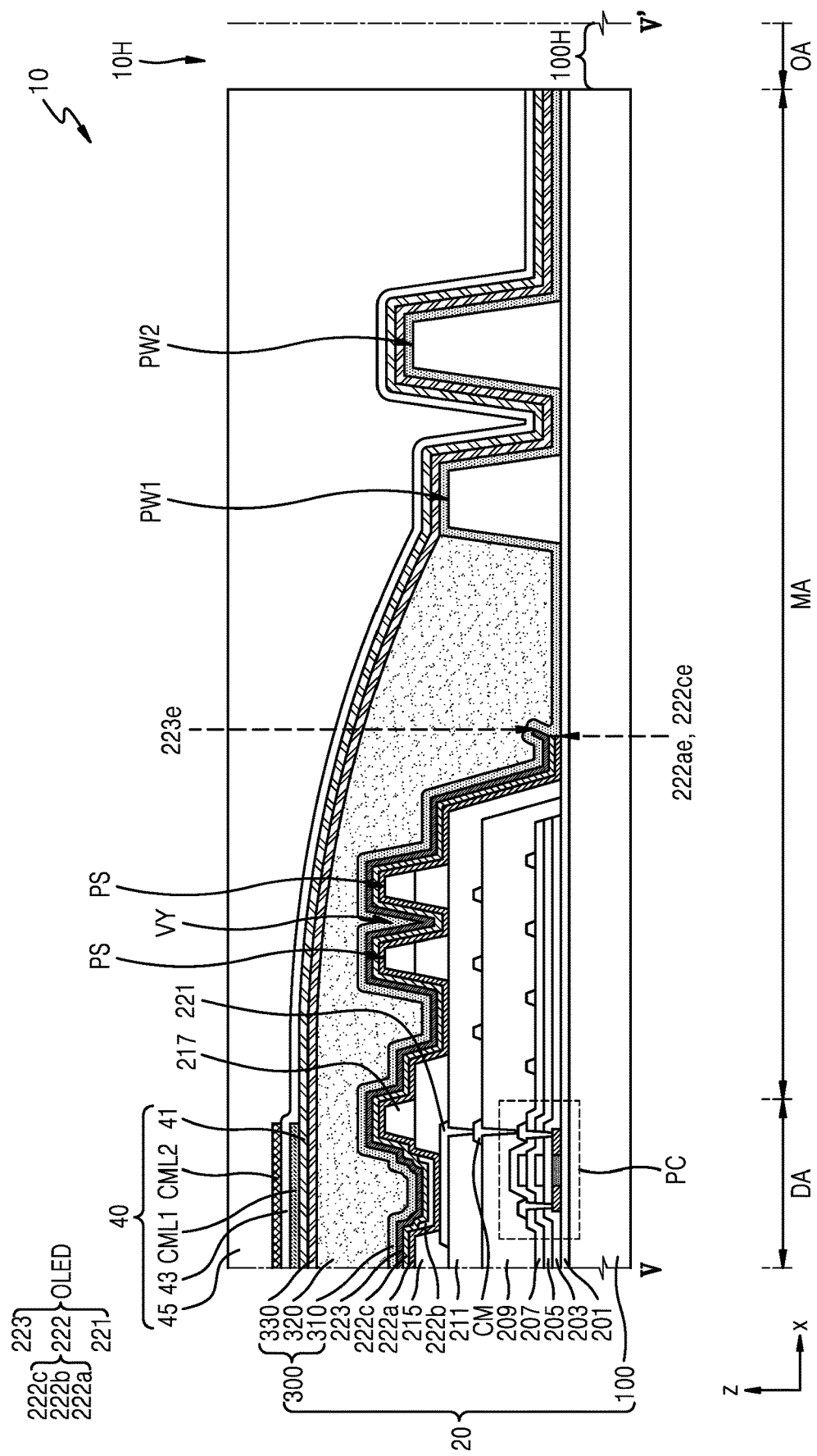
FIG. 12 is a cross-sectional view schematically illustrating a display panel according to some embodiments, which may correspond to a cross-section taken along the line V-V' of FIG. 5.

FIG. 12 is a cross-sectional view schematically illustrating a display panel according to some embodiments, which may correspond to a cross-section taken along the line V-V' of FIG. 5.

According to the embodiments illustrated in FIGS. 6 to 11C, the planarization insulating layer 47 covers the intermediate area MA not covered by the organic encapsulation layer 320; however, embodiments according to the present disclosure are not limited thereto.

According to some embodiments, as illustrated in FIG. 12, among the insulating layers included in the input sensing layer 40, the third insulating layer 45 including an organic insulating material may cover the intermediate area MA not covered by the organic encapsulation layer 320. In this case, the planarization insulating layer 47 (see FIG. 6 or the like) described above may be omitted. In the case of having the structure illustrated in FIG. 12, a portion of the third insulation layer 45 may be in the space between the partitions, for example, the space between the first partition PW1 and the second partition PW2.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate including an opening penetrating from an upper surface to a lower surface of the substrate;
   a light emitting diode in a display area around the opening and including:
      a pixel electrode;
      an opposite electrode; and
      an intermediate layer between the pixel electrode and the opposite electrode; and
   a thin film encapsulation layer on the light emitting diode and including an organic encapsulation layer and at least one inorganic encapsulation layer,
   wherein the opposite electrode and at least one organic material layer of the intermediate layer extend toward the opening, wherein a portion of the opposite electrode facing the opening protrudes further toward the opening than the at least one organic material layer and includes a burr covered by the organic encapsulation layer.

2. The display panel of claim 1, wherein an edge of the opposite electrode facing the opening is closer to the opening than an edge of the at least one organic material layer.

3. The display panel of claim 1, wherein the at least one organic material layer includes at least one of a hole transport layer, a hole injection layer, an electron transport layer, or an electron injection layer.

4. The display panel of claim 1, wherein the burr includes silver (Ag), magnesium (Mg), aluminum (Al), platinum (Pt), palladium (Pd), gold (Au), nickel (Ni), neodymium (Nd), iridium (Ir), chromium (Cr)), lithium (Li), calcium (Ca), or an alloy thereof.

5. The display panel of claim 1, further comprising a first partition between the display area and the opening,
wherein an edge of the opposite electrode and an edge of the at least one organic material layer is closer to the display area than the first partition.

6. The display panel of claim 5, further comprising a second partition closer to the opening than the first partition,
wherein a height of the second partition is different from a height of the first partition.

7. The display panel of claim 6, further comprising a third partition closer to the opening than the second partition,
wherein a height of the third partition is smaller than the height of the first partition and the height of the second partition.

8. The display panel of claim 6, further comprising:
a transistor electrically connected to the light emitting diode; and
an organic insulating layer between the transistor and the light emitting diode.

9. The display panel of claim 8, further comprising a structure on the organic insulating layer and including a plurality of protrusions and a concave valley between the plurality of protrusions,
wherein a portion of the organic encapsulation layer is in the concave valley.

10. The display panel of claim 9, further comprising signal lines on the substrate,
wherein at least one of the signal lines includes a bypass portion bypassing around the opening, wherein the bypass portion overlaps the plurality of protrusions or the concave valley.

11. The display panel of claim 5, wherein the at least one inorganic encapsulation layer includes a first inorganic encapsulation layer under the organic encapsulation layer and a second inorganic encapsulation layer on the organic encapsulation layer,
wherein the first inorganic encapsulation layer and the second inorganic encapsulation layer directly contact each other in an area between the first partition and the opening.

12. The display panel of claim 11, further comprising a planarization insulating layer on the second inorganic encapsulation layer and overlapping a portion of the organic encapsulation layer and the first partition and including an organic insulating material.

13. The display panel of claim 12, wherein the planarization insulating layer has a closed-loop shape covering a periphery of the opening.

14. The display panel of claim 12, wherein the planarization insulating layer covers the display area and a periphery of the opening.

15. An electronic apparatus comprising:
a display panel comprising:
an opening;
a display area around the opening; and
an intermediate area between the opening and the display area; and
a component overlapping the opening,
the display panel further comprising:
a substrate;
a light emitting diode in the display area and including a pixel electrode, an opposite electrode, and an intermediate layer between the pixel electrode and the opposite electrode;
a transistor in the display area and electrically connected to the light emitting diode;
an organic insulating layer between the transistor and the light emitting diode;
a thin film encapsulation layer on the light emitting diode and including an organic encapsulation layer and at least one inorganic encapsulation layer; and
a first partition on the substrate and surrounding the opening,
wherein the opposite electrode and at least one organic material layer of the intermediate layer extend toward the opening, wherein a portion of the opposite electrode protrudes further toward the opening than the at least one organic material layer and is covered by the organic encapsulation layer,
wherein a portion of the opposite electrode protrudes further toward the opening than the at least one organic material layer and includes a burr including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof.

16. The electronic apparatus of claim 15, wherein the display panel further comprises a plurality of protrusions on the organic insulating layer and closer to the display area than the first partition, and a concave valley between the plurality of protrusions,
wherein a portion of the organic encapsulation layer is in the concave valley.

17. The electronic apparatus of claim 16, wherein the opposite electrode and the at least one organic material layer extend beyond the plurality of protrusions and the concave valley.

18. The electronic apparatus of claim 15, wherein an edge of the opposite electrode facing the opening and an edge of the at least one organic material layer are between the display area and the first partition, wherein the edge of the at least one organic material layer is closer to the display area than the edge of the opposite electrode.

19. The electronic apparatus of claim 15, wherein the at least one organic material layer includes at least one of a hole transport layer, a hole injection layer, an electron transport layer, or an electron injection layer.

20. The electronic apparatus of claim 15, wherein the at least one inorganic encapsulation layer includes a first inorganic encapsulation layer under the organic encapsulation layer and a second inorganic encapsulation layer on the organic encapsulation layer,
wherein the first inorganic encapsulation layer and the second inorganic encapsulation layer directly contact each other in an area between the first partition and the opening.

21. The electronic apparatus of claim 15, wherein the display panel further comprises a second partition closer to the opening than the first partition,
wherein a height of the second partition is greater than a height of the first partition.

22. The electronic apparatus of claim 21, wherein the display panel further comprises a third partition closer to the opening than the second partition,
wherein a height of the third partition is smaller than the height of the first partition and the height of the second partition.

23. The electronic apparatus of claim 15, wherein the display panel further comprises an input sensing layer on the thin film encapsulation layer and including at least one conductive layer and at least one insulating layer.

24. The electronic apparatus of claim 23, wherein the display panel further comprises a planarization insulating layer on the thin film encapsulation layer, overlapping a portion of the organic encapsulation layer and the first partition, and including an organic insulating material.

25. The electronic apparatus of claim 24, wherein the planarization insulating layer has a closed-loop shape covering a periphery of the opening.

26. An electronic apparatus comprising:
   a display panel comprising:
      an opening;
      a display area around the opening; and
      an intermediate area between the opening and the display area; and
   a component overlapping the opening,
   the display panel further comprising:
      a substrate;
      a light emitting diode in the display area and including a pixel electrode, an opposite electrode, and an intermediate layer between the pixel electrode and the opposite electrode;
      a transistor in the display area and electrically connected to the light emitting diode;
      an organic insulating layer between the transistor and the light emitting diode;
      a thin film encapsulation layer on the light emitting diode and including an organic encapsulation layer and at least one inorganic encapsulation layer;
      a first partition on the substrate and surrounding the opening;
      an input sensing layer on the thin film encapsulation layer and including at least one conductive layer and at least one insulating layer; and
      a planarization insulating layer on the thin film encapsulation layer, overlapping a portion of the organic encapsulation layer and the first partition, and including an organic insulating material,
   wherein the opposite electrode and at least one organic material layer of the intermediate layer extend toward the opening, wherein a portion of the opposite electrode protrudes further toward the opening than the at least one organic material layer and is covered by the organic encapsulation layer,
   wherein the at least one insulating layer of the input sensing layer includes the planarization insulating layer and covers a periphery of the opening and the display area.

27. The electronic apparatus of claim 26, wherein the component comprises a sensor or a camera.

\* \* \* \* \*